United States Patent
Yu et al.

(10) Patent No.: US 8,268,722 B2
(45) Date of Patent: Sep. 18, 2012

(54) INTERFACIAL CAPPING LAYERS FOR INTERCONNECTS

(75) Inventors: Jengyi Yu, San Ramon, CA (US); Hui-Jung Wu, Fremont, CA (US); Girish Dixit, San Jose, CA (US); Bart van Schravendijk, Sunnyvale, CA (US); Pramod Subramonium, Beaverton, OR (US); Gengwei Jiang, Lake Oswego, OR (US); George Andrew Antonelli, Portland, OR (US); Jennifer O'loughlin, Portland, OR (US)

(73) Assignee: Novellus Systems, Inc., San Jose, CA (US)

(\*) Notice: Subject to any disclaimer, the term of this patent is extended or adjusted under 35 U.S.C. 154(b) by 269 days.

(21) Appl. No.: 12/688,154

(22) Filed: Jan. 15, 2010

(65) Prior Publication Data

US 2010/0308463 A1    Dec. 9, 2010

Related U.S. Application Data

(60) Provisional application No. 61/183,924, filed on Jun. 3, 2009.

(51) Int. Cl.
*H01L 21/4763* (2006.01)
*H01L 29/40* (2006.01)

(52) U.S. Cl. ........... 438/644; 257/753; 257/E23.141; 257/E21.584

(58) Field of Classification Search .......... 257/753, 257/E23.141, E21.584; 438/644; 156/345.24
See application file for complete search history.

(56) References Cited

U.S. PATENT DOCUMENTS

| 4,282,268 | A | 8/1981 | Priestley et al. |
| 5,447,887 | A | 9/1995 | Filipiak et al. |
| 5,975,740 | A | 11/1999 | Lin et al. |
| 6,143,657 | A | 11/2000 | Liu et al. |
| 6,153,523 | A | 11/2000 | Van Ngo et al. |
| 6,181,013 | B1 | 1/2001 | Liu et al. |

(Continued)

FOREIGN PATENT DOCUMENTS

EP    2259303    12/2010

(Continued)

OTHER PUBLICATIONS

Novellus Systems, Inc., van Schravendijk et al., "Protection of CU Damascene Interconnects by Formation of a Self-Aligned Buffer Layer" U.S. Appl. No. 10/980,076, filed Nov. 3, 2004 (37 pages).

(Continued)

*Primary Examiner* — Lex Malsawma
(74) *Attorney, Agent, or Firm* — Weaver Austin Villeneuve & Sampson LLP

(57) ABSTRACT

Adhesive layers residing at an interface between metal lines and dielectric diffusion barrier (or etch stop) layers are used to improve electromigration performance of interconnects. Adhesion layers are formed by depositing a precursor layer of metal-containing material (e.g., material containing Al, Ti, Ca, Mg, etc.) over an exposed copper line, and converting the precursor layer to a passivated layer (e.g., nitridized layer). For example, a substrate containing exposed copper line having exposed Cu—O bonds is contacted with trimethylaluminum to form a precursor layer having Al—O bonds and Al—C bonds on copper surface. The precursor layer is then treated to remove residual organic substituents and to form Al—N, Al—H bonds or both. The treatment can include direct plasma treatment, remote plasma treatment, UV-treatment, and thermal treatment with a gas such as $NH_3$, $H_2$, $N_2$, and mixtures thereof. A dielectric diffusion barrier layer is then deposited.

23 Claims, 12 Drawing Sheets

U.S. PATENT DOCUMENTS

| | | | |
|---|---|---|---|
| 6,271,595 | B1 | 8/2001 | McGahay et al. |
| 6,518,167 | B1 | 2/2003 | You et al. |
| 6,573,604 | B1 | 6/2003 | Kajita |
| 6,750,541 | B2 | 6/2004 | Ohtsuka et al. |
| 6,777,323 | B2 | 8/2004 | Kakamu |
| 6,821,890 | B2 | 11/2004 | McGahay et al. |
| 6,855,645 | B2 | 2/2005 | Tang et al. |
| 6,869,873 | B2 | 3/2005 | Bradshaw et al. |
| 6,974,768 | B1 | 12/2005 | Kailasam |
| 7,060,619 | B2 | 6/2006 | Cowley et al. |
| 7,202,185 | B1 | 4/2007 | Hausmann et al. |
| 7,211,509 | B1 | 5/2007 | Gopinath et al. |
| 7,239,017 | B1 | 7/2007 | Yu et al. |
| 7,247,946 | B2 | 7/2007 | Bruley et al. |
| 7,250,679 | B2 | 7/2007 | Otsuka |
| 7,282,438 | B1 | 10/2007 | Yu et al. |
| 7,297,608 | B1 | 11/2007 | Papasouliotis et al. |
| 7,396,759 | B1 | 7/2008 | Van Schravendijk et al. |
| 7,402,532 | B2 * | 7/2008 | Clevenger et al. ............ 438/783 |
| 7,420,275 | B1 | 9/2008 | Yu et al. |
| 7,452,743 | B2 | 11/2008 | Oliver et al. |
| 7,576,006 | B1 | 8/2009 | Yu et al. |
| 7,648,899 | B1 | 1/2010 | Banerji et al. |
| 7,704,873 | B1 | 4/2010 | Yu et al. |
| 7,727,880 | B1 | 6/2010 | Chattopadhyay et al. |
| 7,727,881 | B1 | 6/2010 | Chattopadhyay et al. |
| 7,799,671 | B1 * | 9/2010 | Banerji et al. ................ 438/598 |
| 7,858,510 | B1 * | 12/2010 | Banerji et al. ................ 438/598 |
| 8,021,486 | B1 | 9/2011 | Yu et al. |
| 8,030,777 | B1 | 10/2011 | Van Schravendijk et al. |
| 2001/0006701 | A1 | 7/2001 | Kobayashi et al. |
| 2002/0066411 | A1 | 6/2002 | Chiang et al. |
| 2002/0155702 | A1 | 10/2002 | Aoki et al. |
| 2002/0173158 | A1 * | 11/2002 | Jeng ............................. 438/706 |
| 2003/0209738 | A1 | 11/2003 | Ohto et al. |
| 2004/0097075 | A1 | 5/2004 | Bradshaw et al. |
| 2004/0175921 | A1 | 9/2004 | Cowley et al. |
| 2004/0238963 | A1 | 12/2004 | Fujisawa |
| 2005/0048767 | A1 | 3/2005 | Matsumoto |
| 2005/0127511 | A1 | 6/2005 | Yang et al. |
| 2005/0282378 | A1 | 12/2005 | Fukunaga et al. |
| 2006/0046479 | A1 | 3/2006 | Rajagopalan et al. |
| 2006/0166448 | A1 | 7/2006 | Cohen |
| 2006/0286764 | A1 | 12/2006 | Zhang et al. |
| 2007/0035029 | A1 | 2/2007 | Caubet et al. |
| 2007/0037388 | A1 | 2/2007 | Hohage et al. |
| 2007/0059925 | A1 | 3/2007 | Choi et al. |
| 2007/0105377 | A1 | 5/2007 | Koos et al. |
| 2010/0308463 | A1 | 12/2010 | Yu et al. |

FOREIGN PATENT DOCUMENTS

| | | |
|---|---|---|
| JP | 56157037 | 12/1981 |
| JP | 09082696 A | 3/1997 |
| JP | 2000-252278 | 9/2000 |

OTHER PUBLICATIONS

U.S. Appl. No. 11/710,652, filed Feb. 22, 2007, Entitled: "Improved Diffusion Barrier and Etch Stop Films".

Office Action dated Jun. 13, 2007, Novellus Systems, Inc., van Schravendijk et al., "Protection of CU Damascene Interconnects by Formation of a Self-Aligned Buffer Layer" U.S. Appl. No. 10/980,076, filed Nov. 3, 2004.

Renesas Technology Corp., Japan, "Reliability Improvement and its Mechanism for Cu Interconnects with Cu-Al Alloy Seeds", pp. 77 & 78 (ADMETA 2006).

IEEE 07CH37867 45th Annual International Reliability Physics Symposium, Phoenix, 2007, NEC Electronics Corporation, Japan "Analytical Study of Impurity Doping Effects on Electromigration of Cu Interconnects by Employing Comprehensive Scattering Model", pp. 117-121.

IEEE © 2004, Taiwan Semiconductor Manufacturing Company, Ltd., "High Performanc Cu interconnects capped with Full-Coverage ALD TaNx layer for Cu/Low-k (k~2.5) Metallization", pp. 72-74.

IEEE © 2005, NEC Corporation and NEC Electronics, Japan, A Robust 45 nm-node, Dual Damascene Interconnects with High Quality Cu/barrier Interface by a Novel Oxygen Absorption Process (4) four pages.

U.S. Office Action, mailed Nov. 28, 2007, for U.S. Appl. No. 10/980,076.

U.S. Office Action, mailed Aug. 21, 2008 for U.S. Appl. No. 11/888,323.

U.S. Office Action, mailed Apr. 2, 2009 for U.S. Appl. No. 12/074,108.

Quirk, "Semiconductor manufacturing technology", 2001, Prentice Hall, pp. 522-527.

Notice of Allowance and Fee Due mailed Jun. 17, 2009 for U.S. Appl. No. 11/888,323 and Allowed Claims.

U.S. Office Action mailed Sep. 1, 2009 for U.S. Appl. No. 11/709,293.

U.S. Office Action mailed Sep. 4, 2009 for U.S. Appl. No. 11/709,294.

Novellus Systems, Inc., Banerji et al., "Interfacial Layers for Electromigration Resistance Improvement in Damascene Interconnect" U.S. Appl. No. 12/630,457, filed Dec. 3, 2009.

Notice of Allowance and Fee Due, mailed Sep. 4, 2009, for U.S. Appl. No. 12/074,108 and Allowed Claims.

U.S. Notice of Allowance and Allowed Claims mailed Jan. 29, 2010 for U.S. Appl. No. 11/709,293.

U.S. Notice of Allowance and Allowed Claims mailed Feb. 22, 2010 for U.S. Appl. No. 11/709,294.

Novellus Systems, Inc., Chattopadhyay et al., "Protective Self-Aligned Buffer Layers for Damascene Interconnects", U.S. Appl. No. 12/762,223, filed Apr. 16, 2010.

Novellus Systems, Inc., Chattopadhyay et al., "Protective Self-Aligned Buffer Layers for Damascene Interconnects", U.S. Appl. No. 12/763,545, filed Apr. 20, 2010.

Novellus Sytstems, Inc., Banerji et al., "Interfacial Layers for Electromigration Resistance Improvement in Damaascene Interconnects", U.S. Appl. No. 12/689,803, filed Jan. 19, 2010.

Novellus Sytstems, Inc., Yu et al., "Protective Self-Aligned Buffer Layers for Damascene Interconnects", U.S. Appl. No. 12/693,645, filed Jan. 26, 2010.

U.S. Notice of Allowance and Allowed Claims, mailed Jun. 28, 2010, for U.S. Appl. No. 12/630,457.

U.S. Notice of Allowance and Allowed Claims for U.S. Appl. No. 12/689,803 mailed Aug. 12, 2010.

U.S. Office Action for U.S. Appl. No. 12/693,645 mailed Dec. 3, 2010.

U.S. Office Action for U.S. Appl. No. 11/671,161 mailed Dec. 12, 2008.

U.S. Final Office Action for U.S. Appl. No. 11/671,161 mailed Jun. 17, 2009.

U.S. Office Action for U.S. Appl. No. 11/671,161 mailed Oct. 29, 2009.

U.S. Final Office Action for U.S. Appl. No. 11/671,161 mailed Feb. 19, 2010.

U.S. Office Action for U.S. Appl. No. 11/671,161 mailed Aug. 17, 2010.

U.S. Final Office Action for U.S. Appl. No. 11/671,161 mailed Dec. 6, 2010.

U.S. Notice of Allowance and Allowed Claims for U.S. Appl. No. 12/693,645, mailed May 18, 2011.

U.S. Office Action mailed Aug. 9, 2011 for U.S. Appl. No. 12/467,200.

Office Action dated Mar. 15, 2012 issued in U.S. Appl. No. 12/762,223.

* cited by examiner

INTERFACIAL CAPPING LAYERS FOR INTERCONNECTS

CROSS-REFERENCE TO RELATED APPLICATIONS

This application claims priority under 35 USC 119(e) from U.S. Provisional Patent Application No. 61/183,924 naming Yu et al. as inventors, titled "Interfacial Capping Layers for Interconnects," filed Jun. 3, 2009, which is incorporated herein by reference in its entirety for all purposes.

FIELD OF THE INVENTION

The present invention pertains to methods of forming layers of material on a partially fabricated integrated circuit. Specifically, the invention pertains to methods for forming an adhesion layer on or within copper lines for improving adhesion of copper to dielectric diffusion barrier layers and therefore improving interconnect reliability.

BACKGROUND

Disclosed are methods of forming layers of material on a partially fabricated integrated circuit. Specifically, the disclosed methods form an adhesion layer on or within copper lines for improving electromigration properties of interconnects such as those used in Damascene structures.

Damascene processing is a method for forming metal lines on integrated circuits. It involves formation of inlaid metal lines in trenches and vias formed in a dielectric layer (inter layer dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal is deposited onto a patterned dielectric to fill the vias and trenches formed in the dielectric layer. The resulting metallization layer is typically formed either directly on a layer carrying active devices, or on a lower-lying metallization layer. A thin layer of a dielectric diffusion barrier material, such as silicon carbide or silicon nitride, is deposited between adjacent metallization layers to prevent diffusion of metal into bulk layers of dielectric. In some cases, the silicon carbide or silicon nitride dielectric diffusion barrier layer also serves as an etch stop layer during patterning of inter layer dielectric (ILD).

In a typical integrated circuit (IC), several metallization layers are deposited on top of each other forming a stack, where metal-filled vias and trenches serve as IC conducting paths. The conducting paths of one metallization layer are connected to the conducting paths of an underlying or overlying layer by a series of Damascene interconnects.

Fabrication of these interconnects presents several challenges, which become more and more significant as the dimensions of IC device features continue to shrink. There is a strong need for interconnect fabrication methods that can provide interconnects with improved lifetime and reliability.

SUMMARY

One challenging problem encountered during IC fabrication is electromigration failure. Electromigration occurs when high current densities experienced by an interconnect lead to migration of metal atoms with the current, and, consequently, lead to formation of voids within interconnects. Ultimately, formation of voids may lead to failure of the device, known as electromigration failure. During ongoing miniaturization of IC devices, interconnect dimensions are decreased, and larger current densities are experienced by interconnects. As a consequence, the probability of electromigration failure increases with such device miniaturization. While copper has a greater electromigration resistance than aluminum, even in copper interconnects, electromigration failure becomes a significant reliability problem at 45 nm technology node and at more advanced nodes.

Electromigration failure has been attributed to the following causes. First, the copper surface can be oxidized easily upon exposure to air or trace amounts of oxygen to form copper oxide. However, copper oxide has a relatively weak bond energy (<200 kJ/mol) in comparison to other oxides such as $SiO_2$, $Al_2O_3$, or $TiO_2$ (>300 kJ/mol). Further, there is poor interfacial bonding energy and therefore poor adhesion between dielectric copper diffusion barrier layer (e.g., SiN, SiC, or SiCN) and copper line. Poor adhesion has been attributed to the presence of surface copper oxide and/or weaker cohesive strength between dielectric diffusion barrier materials (e.g., SiN, SiC, or SiCN) and copper as compared to copper-metal interactions.

Adhesion layers residing at an interface between metal (e.g., copper) lines and dielectric diffusion barrier (or etch stop) layers that are capable of improving electromigration performance of interconnects are herein provided. Methods for forming such caps are also described. Advantageously, the described adhesion layers can be formed as very thin layers residing on the upper portion of a metal line at its interface with the dielectric diffusion barrier layer, without significantly increasing interconnect resistance. In some embodiments, no substantial diffusion of capping material into the metal line occurs, and the adhesion layer is cleanly segregated at the very top of the line, e.g., on or within the top portion of the line.

The embodiments described herein pertain to a method for capping or passivating the surface of copper interconnects with an atomic layer (or a layer having a thickness near atomic) of a second metal (e.g., Al, Ti, Mg, or Ca) or its compounds (e.g., compounds having metal-oxygen, metal-nitrogen, metal-carbon bonds, or their mixtures). The disclosed implementations involve exposing the copper interconnect surface to at least one metal-containing precursor in order to form an atomic layer (a monolayer or a few monolayers) of adsorbed metallic atoms (which can be chemically bonded to the surface), then optionally converting this precursor layer to a passivated layer (e.g., to a dielectric layer having metal-oxygen, metal-nitrogen, metal-carbon bonds and essentially no free metal) on copper surface. With this approach, adhesion of dielectric copper diffusion barrier (SiN or SiC, etc.) to Cu is improved significantly while the resistance of copper interconnect remains unchanged because there is minimal to no dopant diffusion into bulk copper lines. The meantime to failure of copper electromigration (EM) is improved as well.

Advantageously, a thin adhesion layer formed in this controlled manner do not significantly increase the resistance of interconnects, as often inadvertently happens when large amounts of highly reactive or easily diffusing dopants (e.g., Si, or Ge) are deposited onto the interconnect metal. In addition, as it will be described, provided methods are suitable for forming adhesions layer from precursor materials that are deposited with little or no selectivity onto both exposed metal and dielectric. It is understood that methods can be also used when the precursor deposits selectively onto the metal layer without significantly depositing onto the dielectric.

According to one aspect, a method for forming a semiconductor device structure is provided. In one embodiment, the method includes the operations of (a) contacting a substrate having an exposed layer of a first metal (e.g., copper or copper alloy) and an exposed layer of dielectric with a precursor compound comprising a second metal selected from the group consisting of aluminum, titanium, magnesium, and calcium, to deposit a precursor layer over both the dielectric and the first metal; (b) optionally modifying the precursor layer at least over the region of the first metal to form an adhesion layer; and (c) depositing a dielectric diffusion barrier layer in contact with the adhesion layer. The precursor layer, in general, may contain one or more of free metal, metal-oxygen, metal-nitrogen, and metal-carbon bonds. In some embodiments, the precursor layer may serve as an adhesion layer without requiring further modification. In other embodiments, a modifying treatment is necessary, e.g., to remove unwanted organic substituents, and/or to form metal-nitrogen, metal-oxygen, metal-carbon, metal-hydrogen bonds or mixtures thereof. The type of modifying post-treatment will depend on many factors, such as the type of the second metal, the nature of the precursor, the nature of the formed precursor layer, as well as on specific inter-layer dielectric and diffusion barrier materials.

In some embodiments, it is preferable that the exposed layer of a first metal M1 contains a controlled small amount of M1-oxygen bonds. For example, in some embodiments, a metal oxide layer (e.g., copper oxide layer) having a thickness of no more than 10 Å is preferred. In these embodiments, a metal-containing precursor containing second metal M2 (e.g., an organometallic precursor containing Al, Ti, Ca, or Mg) will controllably react with the oxide to form a precursor layer comprising M2-oxygen bonds, having nearly atomic thickness. For example, when the substrate containing a controlled amount of copper oxide on its surface is treated with trialkylaluminum, e.g., trimethylaluminum (TMA), at an appropriate temperature (substrate temperature of between about 80-350° C.), the organometallic precursor will react with the copper oxide surface to form a nearly atomic layer of precursor material comprising Al—O bonds. The precursor material further includes Al—C bonds from residual methyl groups, which, in some embodiments, are subsequently removed by a post-treatment, designed to form Al—N, Al—H bonds or both, while Al—O bonds connecting the layer to copper surface remain. As a result an adhesion layer containing O—Al—N and/or O—Al—H bonding will be formed. The post-treatment can include direct plasma treatment, remote plasma treatment, UV-treatment, and thermal treatment with a gas containing $NH_3$, $H_2$, $N_2$, or mixtures thereof. After the post-treatment is completed, a dielectric diffusion barrier layer, such as a layer containing doped or undoped SiC, SiN or SiCN is deposited. The resulting structure may have O-M2-N—Si bonding, such as O—Al—N—Si.

For those embodiments which rely on the reaction of organometallic precursor with surface copper oxide, the preparation of copper surface prior to contact with the organometallic precursor, is of high importance. Typically, the substrates obtained in semiconductor processing contain relatively large amounts of surface copper oxide (e.g., more than 20 Å) and may also contain other contaminants. While substrates with such large amounts of oxide can be used in some embodiments to form thicker adhesion layers, it is more preferable to reduce the amount of oxide to a nearly atomic layer, in order to obtain a more controlled nearly atomic thickness of the adhesion layer. It is noted that in the described embodiments, complete removal of oxide is not desired, because the organometallic precursor will not react with the oxide-free surface, and oxide of the second metal will not be formed. In other embodiments, however, oxide may not be needed, if a precursor layer of a different type (e.g., free metal precursor layer) is formed.

A variety of pre-treatments can be used to partially remove copper oxide which include direct plasma treatment, remote plasma treatment, UV-treatment, and thermal treatment with a reducing gas, such as with a gas containing $NH_3$, $H_2$, $N_2$, or mixtures thereof. In some embodiments, the copper oxide is removed completely (e.g., using more aggressive or prolonged pre-clean conditions) and a new layer of copper oxide having controlled thickness (e.g., no more than about 10 Å) is grown on the copper surface by contacting exposed copper with oxygen-containing process gas (e.g., containing $O_2$ and/or $H_2O$) under strictly controlled conditions.

Notably, in many embodiments, the copper line resides in a layer of ultra low-k (ULK) dielectric having a dielectric constant of less than about 2.8. These materials are often mechanically weak and can be easily damaged. In some embodiments, pre-treatment of copper surface, and/or post-treatment of adhesion layer (e.g., nitridizing post-treatment) are performed such as to minimize damage to the exposed dielectric layer. In some cases, direct plasma treatment may be too damaging for porous and/or organic dielectric materials, and UV treatment, thermal treatment, or remote plasma treatments are preferred. Pre-clean, deposition of the precursor layer, and post-treatment may be performed in a CVD apparatus without a vacuum break, e.g., in the same process chamber. In some embodiments, it is preferable that the substrate remains in a reducing atmosphere throughout pre-clean, precursor layer deposition, and post-treatment processes.

In some embodiments, metal-containing precursor layers are formed by contacting the substrate with a volatile metal-containing precursor, such as metal halide, metal hydride, metal carbonyl, or a volatile organometallic compound, under temperatures and pressures suitable for adsorbing the precursor on the exposed metal interconnect and/or causing precursor decomposition and/or reaction with surface oxide to form a metal-containing precursor layer on a substrate.

A number of metals are suitable as elements for forming the adhesion layers. These include, for example, Al, Ti, Ca, and Mg. Alloys and solid solutions of these metals with each other or with other metals may be also employed. Suitable volatile precursors for an aluminum-containing precursor layer include but are not limited to trimethylaluminum, dimethylaluminum hydride, triethylaluminum, triisobutylaluminum, and tris(diethylamino)aluminum. Suitable precursors for deposition of titanium-containing precursor layers include but are not limited to tetrakis(dimethylamino)titanium (TDMAT), tetrakis(diethylamino)titanium (TDEAT), tetrakis(ethylmethylamido)titanium, and bis(diethylamino)bis(diisopropylamino)titanium.

As mentioned, after the precursor layer containing metal is applied, it is optionally modified to form a capping adhesion layer, e.g., to form an adhesion layer containing metal-nitrogen, metal-oxygen, metal-carbon, metal-hydrogen bonds or combinations thereof.

Generally, a number of processes can be used to further modify the precursor layers. In one embodiment, the precursor layer is modified by exposing the substrate to a nitrogen-containing reactant in a plasma discharge. For example, $NH_3$, $N_2H_4$, amines, $N_2$ and mixtures thereof can be used. In a specific example, an aluminum or aluminum oxide layer is modified by contacting the substrate with a mixture of $N_2$ and $NH_3$ in a plasma. In other embodiments, a precursor layer is modified by exposing the substrate to an oxygen-containing compound (e.g., $O_2$, $N_2O$, or $CO_2$) in a plasma discharge, to form an adhesion layer containing metal-oxygen bonds. Yet in other embodiments a metal or metal oxide precursor layer is modified with a carbon containing reactant (e.g., $C_xH_y$) in a plasma to form a passivated layer containing metal-carbon bonds. As previously mentioned, metal-nitrogen bonds and/or removal of alkyl groups from the precursor layer can be also performed by remote plasma treatment, UV-treatment, and thermal treatment with a gas containing $NH_3$, $H_2$, $N_2$, or mixtures thereof.

In some embodiments, after the precursor layer is formed (and optionally modified to form an adhesion layer), an etch stop layer or a dielectric diffusion barrier layer (e.g., a layer comprising doped or undoped silicon carbide or silicon nitride) is deposited onto the adhesion layer. In other embodiments, the capping layer itself may serve as an etch stop layer or a dielectric diffusion barrier layer, and no separate etch stop layer is required. In the latter embodiment inter-metal dielectric is deposited directly onto the capping layer.

Advantageously, in some embodiments, the entire cap-forming process, and diffusion barrier (or etch stop) deposition process are performed sequentially in one module without a vacuum break. A PECVD module apparatus having multiple stations within one chamber, or having multiple chambers, is a suitable apparatus for such deposition. Both metal-containing layers and dielectric layers can be deposited sequentially in one PECVD apparatus without a vacuum break. For example, in one embodiment, the process involves depositing a metal-containing precursor layer, converting the precursor layer to a metal oxide capping layer, modifying the capping layer by contact with a nitrogenous plasma, and forming the dielectric diffusion barrier or an etch stop layer, wherein all operations are performed in one apparatus without a vacuum break.

The devices formed using these methods may have improved electromigration properties and also may exhibit greater adhesion at the metal/dielectric diffusion interface.

According to another aspect, a semiconductor device is provided. The semiconductor device includes a region of dielectric material and a region of copper or copper alloy which is embedded in the dielectric material. The device further includes a layer comprising a metal oxide, such as aluminum oxide, which is disposed on the layer of dielectric and on the region of copper or copper alloy. The metal oxide layer may be modified to incorporate some nitrogen, at least on the face opposite the copper interconnect. In some embodiments, the metal oxide is selectively located on the copper or copper alloy, with little or no metal oxide on the dielectric layer. In one embodiment, the device comprises a layer of copper embedded in a ULK dielectric layer having a dielectric constant of less than about 2.8; and a dielectric diffusion barrier layer at an interface between the copper layer and the ULK dielectric layer, wherein the interface includes an adhesion layer having O-M2-N—Si adhesion (resulting from, e.g., bonding) between the copper layer and the dielectric diffusion barrier layer, wherein M2 is selected from the group consisting of Al, Ti, Ca, and Mg.

According to another aspect, an apparatus for forming a adhesion layer on or within a metal portion of a partially fabricated semiconductor device, is provided. The apparatus includes: (a) a process chamber having an inlet for introduction of reactants; (b) a wafer support for holding the wafer in position during formation of the adhesion layer; and (c) a controller comprising program instructions for depositing the adhesion layer. The instructions include instructions for: (i) applying a precursor layer comprising metal over exposed portions of metal and optionally the dielectric on the wafer substrate; and (ii) optionally modifying the precursor layer (e.g., a metal or metal oxide layer) by contact with nitrogen, carbon, and/or oxygen containing environment such as a plasma. In some embodiments the apparatus is a PECVD apparatus. The recited operations may be performed sequentially at one station of a multi-station apparatus. In other embodiments, some operations may be performed at a first station of the apparatus, while others may be performed at a different station. One station may be configured for processes performed at a first temperature, while another station may be configured for processes performed at different temperature. For example, deposition of the precursor layer may be performed at one station of a multi-station apparatus at a first temperature, while subsequent modification of the precursor layer may be performed at a different temperature at a different station. The substrate may be transferred between the stations without a vacuum break. In other embodiments, the process may be analogously implemented in a multi-chamber apparatus, where the substrate may be transferred between the chambers without exposing the substrate to ambient conditions.

In some embodiments the apparatus includes one or more process chambers configured for semiconductor device processing and a controller comprising program instructions for: (a) pre-treating a semiconductor substrate having an exposed metal oxide layer to controllably remove a portion of the metal oxide without completely removing all of the metal oxide; (b) contacting the semiconductor substrate with a precursor compound comprising a second metal M2 to react with the metal oxide and to form an adhesion layer comprising M2-oxygen bonds at least on the layer of the first metal; and (c) depositing a dielectric diffusion barrier onto the semiconductor substrate in contact with the adhesion layer. In some embodiments, the instructions for forming the adhesion layer comprise instructions for contacting the substrate with an organometallic precursor in an absence of plasma to form a precursor layer having M2-O bonds and subsequently post-treating the precursor layer to remove organic substituents (e.g., alkyl groups) from the layer and to form M2-N and/or M2-H bonds. The instructions for post-treatment may include instructions for direct plasma treatment, remote plasma treatment, UV-treatment, and thermal treatment with a gas containing $NH_3$, $H_2$, $N_2$, or mixtures thereof.

These and other features and advantages of the present invention will be described in more detail below with reference to the associated drawings.

DETAILED DESCRIPTION OF A PREFERRED EMBODIMENT

Introduction and Overview

Figure 1A:
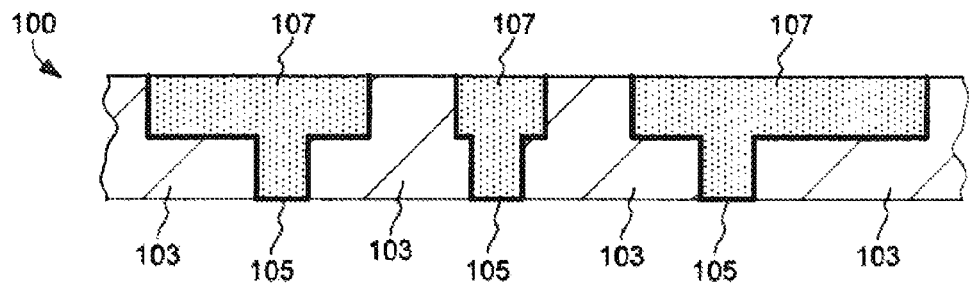
FIGS. 1A-1E show cross sectional depictions of device structures created during a copper dual Damascene fabrication process.

Electromigration is becoming a significant reliability problem in IC fabrication, as the dimensions of devices continue to decrease, and current densities experienced by interconnects are increasing. Electromigration manifests itself in migration of metal atoms with the current, and in formation of voids within the interconnect. Formation of voids can subsequently lead to device failure. Migration of metal atoms is particularly pronounced at metal/diffusion barrier interfaces and along grain boundaries. At 90 nm and 45 nm technology nodes and beyond, methods for improving electromigration performance are needed. While electromigration performance can be improved by introducing dopant elements into interconnect, such dopants are typically have higher resistivity than the interconnect metal (e.g., Cu) and can significantly increase interconnect resistance. Thus, uncontrolled doping of interconnect metal can lead to interconnects with unacceptably high resistance.

A method for a controlled formation of adhesion layers (also referred to as adhesion layers) on or within a metal interconnect surface is disclosed herein. As a result, very thin (e.g., having nearly atomic thickness) adhesion layers can be formed on the upper portion of metal lines, typically, at the interface between the metal and the dielectric diffusion barrier (or etch stop) layer. The adhesion layers include a bonded or unbonded metal, such as free unbonded metal, oxygen-bonded metal, nitrogen-bonded metal, carbon-bonded metal or their combinations. Examples of the metals for the capping layer (whether existing in free metallic form or as an oxide or other compound thereof) include aluminum, titanium, calcium, and magnesium. These metals can also be used in combinations with each other or with other elements. In general, a variety of metals can be used. Specific examples of bonding in adhesion layers residing at an interface between copper line and a dielectric diffusion barrier (e.g., SiC or SiN) include O—M2—N—Si, where M2 is selected from the group consisting of Al, Ti, Ca, and Mg. In some embodiments, the metal M2 in the adhesion layer is bonded (preferably including O-M2 motif) and essentially no free metal remains in the adhesion layer. In other embodiments free metal may be present in addition to the bonded metal, or substantially all of the adhesion metal may be present in free form (or as an alloy with the line metal). The nature of the adhesion layer will depend on particular precursors used, and on deposition conditions.

In some embodiments, a device comprising O—Al—N—Si bonding is formed by contacting a substrate having an exposed copper layer having Cu—O bonds on the surface with a trialkylaluminum precursor in an absence of plasma to form a thin nearly atomic layer containing Al—O bonds. The layer is then post-treated to form Al—N and/or Al—H bonds and to remove residual alkyl groups, while Al—O bonds remain. After post-treatment, a dielectric diffusion barrier layer comprising doped or undoped SiC, SiN, or SiCN is deposited by PECVD in contact with the adhesion layer.

Formation of adhesion layers on interconnect surfaces will be illustrated in the context of a copper dual Damascene processing. It is understood, that methods disclosed herein can be used in other processing methods, including single Damascene processing, and can be applied to a variety of interconnect metals beyond copper. For example, these methods can be applied to aluminum, gold, and silver-containing interconnects.

Other available techniques for protecting copper interconnects include the following, which may in some instances be used in conjunction with the thin surface layer protection described above.

1. Dopant Diffusion

The presence of alloying elements (foreign metallic atoms) in copper can improve EM performance due to interactions of the dopant and copper in the lattice. This approach, in some embodiments, is implemented by using a Cu—Al alloy seed layer for Cu electroplating. In this approach, after the vias and trenches have been formed in the dielectric layer, and after they have been conformally lined with a partially conductive diffusion barrier material (which may include Ta, Ti, W and nitrides thereof), a seed layer material containing both copper and aluminum is conformally deposited typically by PVD. The vias and trenches are then filled with copper typically by electroplating, and aluminum is allowed to diffuse into copper-filled lines typically after a thermal anneal. In other embodiments, after the copper lines have been filled with copper, a layer of aluminum is deposited on copper surface (e.g., by PVD or CVD) and thermal anneal is conducted to allow aluminum diffuse into copper.

2. Self-Aligned Barrier (SAB)

A capping layer on copper surface can also improve copper electromigration resistance. This approach is achieved in some embodiments using metallic alloy cap deposition, e.g., CoWP cap deposition. In this approach, a CoWP layer is selectively electrolessly deposited on copper surface without depositing on adjacent dielectric. Such caps can significantly improve electromigration performance of copper interconnects. However, a potential drawback of this kind of metallic barriers is that their deposition selectivity is typically poor on IMD dielectric surface. Therefore, metallic elements deposited between copper lines can cause leakage current and result in poor TDDB (Time Dependent Dielectric Breakdown).

In other embodiments PECVD self-aligned barriers are used, in which CuSiN barrier layers are formed within copper lines using PECVD. This method alleviates the potentially poor selectivity issues of CoWP capping mentioned above. In this method, the copper surface is pre-cleaned to remove copper oxide, and silane is contacted with the substrate in an absence of plasma to selectively form copper silicide at the upper surface of the interconnect line without reacting with the dielectric. "Nitrogen pinning" is then effected by applying an $NH_3$ anneal/plasma to form a CuSiN barrier. In other words, the CuSiN barrier is formed by modifying the surface of the copper interconnect, rather than by a deposition technique. This technique has a trade-off between EM improvement and Cu resistance increase.

Damascene Process Flow

Presented in FIGS. 1A-1D, is a cross sectional depiction of device structures created on a semiconductor substrate at various stages of a dual Damascene fabrication process. A cross sectional depiction of a completed structure created by the dual Damascene process is shown in FIG. 1E. "Semiconductor substrate" as used in this application is not limited to the semiconductor portions of an IC device, but is broadly defined as a semiconductor-containing substrate. Referring to FIG. 1A, an example of a partially fabricated IC structure, 100, used for dual Damascene fabrication is illustrated. Structure 100, as illustrated in FIGS. 1A-1D, is part of a semiconductor substrate, and, in some embodiments, may directly reside on a layer containing active devices, such as transistors. In some embodiments, it may directly reside on a metallization layer or on other layers that incorporate conductive materials, e.g., layers containing memory capacitors.

A layer 103 illustrated in FIG. 1A is a layer of inter-metal dielectric, which may be silicon dioxide but is more typically a low-k dielectric material. In order to minimize the dielectric constant of the inter-metal dielectric stack, materials with a k value of less than about 3.5, preferably less than about 3.0 and often as lower than about 2.8 are employed as inter layer dielectrics. These materials include but are not limited to fluorine or carbon doped silicon dioxide, organic-containing low-k materials and porous doped silicon dioxide based materials known to those of skill in the art. Such materials can be deposited, for example, by PECVD or by spin-on methods.

In some embodiments, ULK dielectrics with low dielectric constant but with relatively poor mechanical properties are used in order to maximize electrical performance of the device. When mechanically weak, porous and organic dielectrics (e.g., dielectrics having k less than about 2.8 such as less than about 2.4) are used, special care is often taken to reduce dielectric damage during processing steps. In some embodiments, the use of direct plasma is entirely avoided in capping layer formation, in order to protect exposed ULK dielectric.

Dielectric layer 103 is etched with line paths (trenches and vias) in which a partially conductive metal diffusion barrier 105 is deposited, followed by inlaying with copper conductive routes 107. Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or inter-layer dielectric and result in degradation of their properties. Several types of metal diffusion barriers are used in order to protect the dielectric layers of the IC device. These types may be divided into partially conductive metal-containing layers such as 105 and dielectric barrier layers which will be described in further detail with reference to FIG. 1B. Suitable materials for partially conductive diffusion barrier 105 include materials, such as tantalum, tantalum nitride, titanium, titanium nitride and the like. These are typically deposited onto a dielectric layer having vias and trenches by a PVD or an ALD method.

Copper conductive routes 107 can be formed by a number of techniques, including PVD, electroplating, electroless deposition, CVD, etc. In some implementations, the method of forming a copper fill includes depositing a thin seed layer of copper by PVD and subsequently depositing bulk copper fill by electroplating. Since copper is typically deposited with overburden residing in the field region, chemical mechanical polishing (CMP) or other material removal operation (such as electropolishing) is needed to remove the overburden and to obtain a planarized structure 100.

Figure 1B:
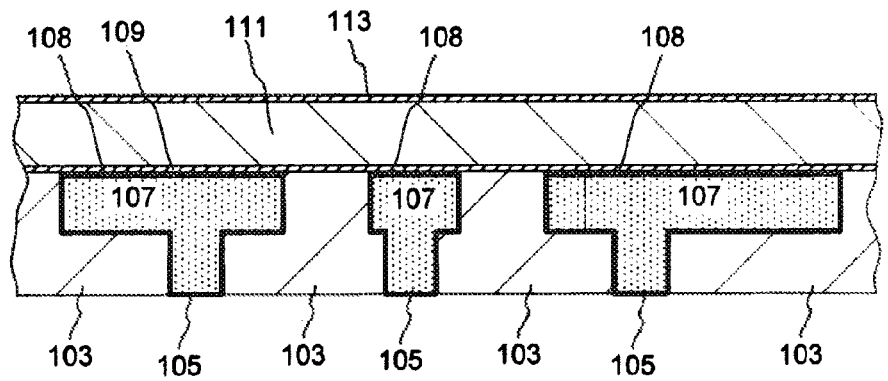

Next, referring to FIG. 1B, after the structure 100 has been completed, the surface of the substrate 100 is optionally pre-cleaned to remove contaminants and metal oxide (e.g., copper oxide). In some embodiments, it is preferable to leave a controlled amount of copper oxide (e.g., a monolayer), such that it would controllably react with a metal-containing precursor to form an adhesion layer of nearly atomic thickness. In some embodiments, no more than 10 Å of metal oxide (e.g., copper oxide) remain on the surface of the metal lines.

After the pre-clean, a precursor layer containing a bound or unbound metal (e.g., Al, Ti, Ca, Mg or combinations thereof) is applied onto copper lines 107 and, in many cases, onto dielectric 103. The copper/dielectric selectivity of deposition may be complete, partial, or it may be entirely absent. The selectivity generally depends on the nature of precursor, nature of dielectric, and on deposition conditions. While FIGS. 1A-1E illustrate selective formation of the adhesion layer 108 at the top portion of copper lines, it is understood that in many embodiments, a metal-containing precursor layer will be formed on the dielectric 103.

When Al, Ti, Ca or Mg are used as the second metal M2 in the adhesion layers, the precursor layer formed on an oxide-containing copper surface, will typically quickly form M2-O bonds. In some embodiments, the volatile metal-containing precursor is adsorbed on the substrate surface and is allowed to react with copper oxide for a period of time. In other cases the reaction is essentially immediate. Typically, an M2-O containing layer will be also spontaneously formed on the layer of dielectric and on exposed portions of partially conductive diffusion barrier (e.g., Ta or TaN), because dielectric and diffusion barrier layers will often contain oxygen on the surface. The precursor layer, in addition to M2-O bonds, can also include M2-C bonds and residual organic groups remaining after partial decomposition of organic precursors.

The precursor layer containing bound or unbound metal in some embodiments may be modified by nitridation, carbonization, or oxidation. A post-treatment may also be used to remove alkyl groups and/or to form M2-H bonds. In the case of aluminum-containing precursor layer having O—Al—C bonding, a nitridizing and/or hydrogenating treatment to form O—Al—N and/or O—Al—H and to remove alkyl residues, is preferred. Oxidative treatment with oxygen-containing process gas is usually less preferred, particularly in the presence of easily damaged ULK dielectric.

In those cases where conductive metal deposited on the dielectric layer has not been completely converted to oxide upon deposition, the precursor layer on the dielectric is completely converted to a non-conductive oxide, nitride or carbide layer (or their combinations) over the regions of dielectric in the post-treatment step, to prevent shorting between adjacent metal lines 107.

The thickness of adhesion layers can be controlled by controlling the amount of material deposited in the precursor layer, and by controlling the degree of modification during post-treatment of the layer. In many embodiments, it is preferable that a thin adsorption-limited layer is formed, corresponding to essentially an atomic monolayer of material. In some embodiments, the thickness of the adhesion layer is controlled by controlling the amount of Cu—O bonds on the copper surface. In some embodiments, it is preferable that no more than 10 Å of copper oxide remain on the surface. Further, while in some embodiments free metal in adhesion layer is permitted, in other embodiments it is preferred that substantially all bonding metal resides in the adhesion layer in a bound form (e.g., containing metal-oxygen, metal-carbon, metal-nitrogen bonds or combinations thereof). Such bonding minimizes diffusion of free metal into copper line and reduces associated increase in resistance. In some embodiments, the thickness of the formed adhesion layer is less than about 20 Å, such as less than about 10 Å.

In some embodiments, an adhesion layer containing metal-oxygen, metal-carbon, metal-nitrogen bonds or their combinations, formed in this manner also serves as a diffusion barrier layer. In other embodiments, a separate diffusion barrier (or etch stop) layer is deposited on top of the adhesion layer. As mentioned, such diffusion barrier layer may include doped or undoped silicon carbide or silicon nitride, as well as silicon carbonitride.

As depicted in FIG. 1B, the film 109 may include a single adhesion layer (e.g., a layer containing Al—O bonds) or a bi-layer containing an adhesion layer adjacent to copper lines 107 and an upper dielectric diffusion barrier layer (e.g., a doped silicon carbide layer) residing on the adhesion layer. In those embodiments, where the thickness of the adhesion layer is no more than about 20 Å, the use of separate dielectric diffusion barrier is usually preferred to ensure a more robust protection against copper diffusion. In some embodiments, if thicker adhesion layers are used, inter-metal dielectric 111 can be deposited directly onto the adhesion layers, without the need for a separate dielectric diffusion barrier layer 109.

In the embodiment where the interface film includes a separate dielectric diffusion barrier layer, the dielectric diffusion barrier layer is deposited on top of the adhesion layer, typically by a PECVD method. In one embodiment, deposition of a precursor layer, post-treatment of the precursor layer, and deposition of dielectric diffusion barrier layer is performed in one PECVD apparatus without breaking the vacuum. In some embodiments, it is preferable to perform copper surface preparation (pre-clean), precursor layer deposition (e.g., TMA exposure), post-treatment of the precursor layer (e.g., nitridation), and all intermediate substrate handling, while maintaining the substrate in a reducing atmosphere (e.g., without exposure to even traces of oxygen or water vapor).

Referring again to FIG. 1B, a first dielectric layer, 111, of a dual Damascene dielectric structure is deposited onto the film 109. This is followed by deposition of an optional etch stop film 113 by a PECVD method on the first dielectric layer 111. The dielectric layer 111 is typically composed of low-k dielectric materials such as those listed for a dielectric layer 103. Note that layers 111 and 103 need not necessarily have identical composition.

Figure 1C:
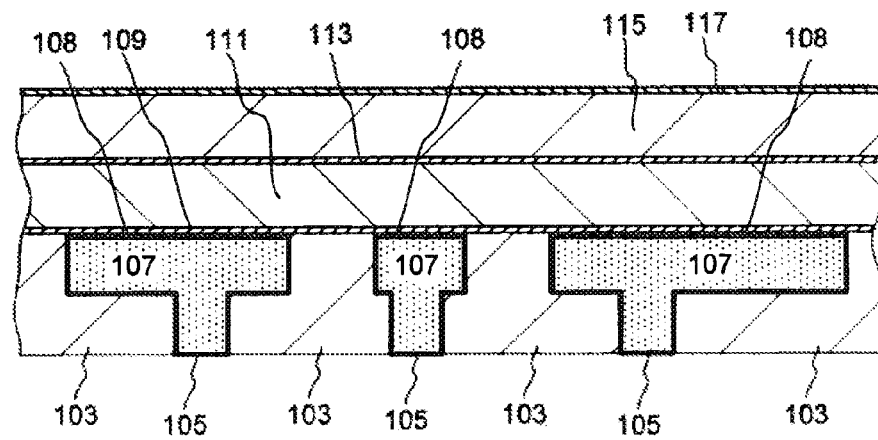

The process follows, as depicted in FIG. 1C, where a second dielectric layer 115 of the dual Damascene dielectric structure is deposited in a similar manner to the first dielectric layer 111, onto an etch-stop film 113. Deposition of an anti-reflective layer (not shown) and a CMP stop film 117 follows. Second dielectric layer 115 typically contains a low-k dielectric material such as those described above for layers 103 and 111. A CMP stop film 117 serves to protect the delicate dielectric material of inter-metal dielectric (IMD) layer 115 during subsequent CMP operations. Typically, a CMP stop layer is subject to similar integration requirements as a diffusion barrier and etch stop films 109 and 113, and can include materials based on silicon carbide or silicon nitride.

Figure 1D:
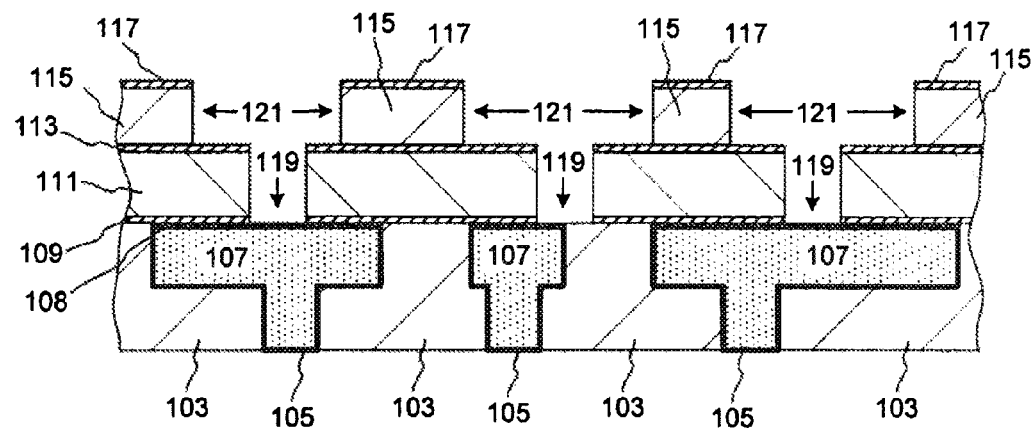
Figure 1E:
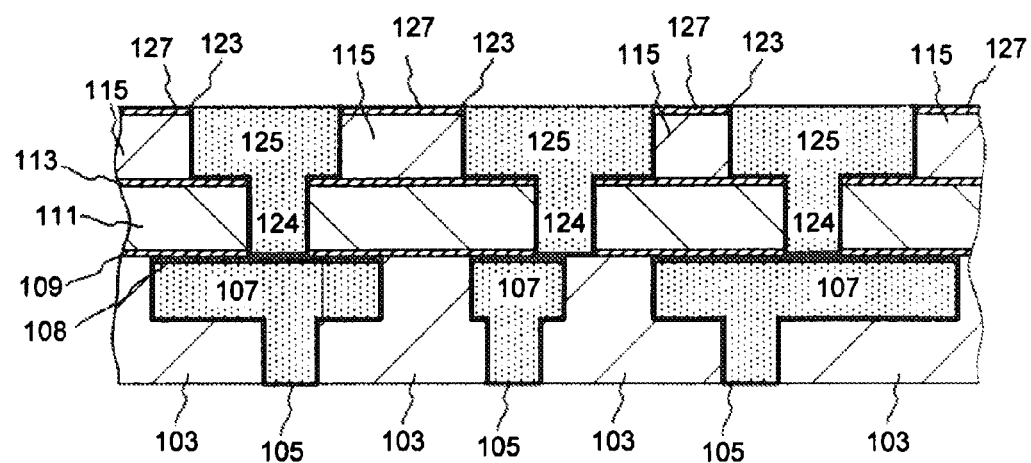

The dual Damascene process continues, as depicted in FIGS. 1D-1E, with etching of vias 119 and trenches 121 in the first and second dielectric layers. Standard lithography techniques are used to etch a pattern illustrated in FIG. 1D. A trench-first or a via-first methods well known by those of skill in the art may be employed.

Next, as depicted in FIG. 1E, these newly formed vias and trenches are, as described above, coated with a metal diffusion barrier 123, which may contain barrier materials, such as tantalum, tantalum nitride, titanium nitride or other materials that effectively block diffusion of copper atoms into the dielectric layers.

After the diffusion barrier 123 has been deposited, a seed layer of copper is applied (typically by a PVD process) to enable subsequent electrofilling of the features with copper inlay. In some embodiments where the metal diffusion barrier is a relatively highly conductive material, no seed layer is required. In either case, the copper layer is deposited e.g., by electrofill, and excess of metal deposited in the field is removed in a CMP operation, performed such that CMP stops at the CMP stop film 117. FIG. 1E shows the completed dual Damascene process, in which copper conductive routes 124 and 125 are inlayed (seed layer not depicted) into the via and trench surfaces over barrier 123. FIG. 1E illustrates three interconnects, where copper lines have been doped in a controlled fashion.

If further processing is required, a dielectric diffusion barrier film similar to film 109 and adhesion layers similar to caps 108 are formed on top of the structure depicted in FIG. 2E, and deposition of a new metallization layer follows.

Device Structures

As it was explained, copper electromigration occurs due to a drift of copper atoms at copper/diffusion barrier interface under an electrical field. One of methods to improve copper electromigration is to increase the cohesive strength or bonding energy between copper and barrier dielectric such that copper atoms will not move under stress. The native copper oxide formed on the Cu surface after CMP and air exposure significantly degrades the adhesion of barrier dielectric onto Cu. In some embodiments, a clean copper surface without copper oxide helps the adhesion at this interface.

In the disclosed process, foreign atoms of at least one metallic element M2 (in bound or unbound form) are introduced onto the copper surface to "pin" surface copper atoms and to prevent electromigration. More than one metallic element may be used in the described adhesion layer. In some embodiments, those metals are selected as bonding agents, which have M2-O bond energy that is greater than that of copper oxide ($Cu_2O$).

The bonding M2 atoms are introduced by exposing the copper surface to at least one precursor containing the bonding metallic element. Organometallic precursors, metal hydrides, metal carbonyls or other appropriate precursors can be used for this purpose. Preferably, the substrate containing exposed copper and dielectric surfaces is exposed to the precursors in an absence of plasma, under appropriate conditions to form a precursor layer. In some embodiments, the copper surface contains a small amount of copper-oxygen bonds on its surface, which are capable of reacting with the precursor to form M2-O bonds. The dielectric will also typically contain oxygen on its surface and will be able to oxidize the precursor to form M2-O bonds.

According to thermodynamics, the free energy of oxide formation for some metallic elements is lower than that of $Cu_2O$ and $SiO_2$. These include $TiO_2$, $Al_2O_3$, MgO, CaO, etc. That means the latter metallic oxides are more stable than $Cu_2O$ and $SiO_2$. For example, when Al atoms are added onto $Cu_2O$ surface, Al atoms will reduce $Cu_2O$ into Cu and form $Al_2O_3$ which is stable and can prevent copper from oxidation when it exposes to air or ambient oxygen. Al in a form of $Al_2O_3$ is stable, impermeant, and immobile and will not diffuse into copper line to increase copper resistance. It will not diffuse into surrounding IMD dielectric layer or form any conducting layer to cause dielectric leakage or increase the dielectric constant, k. Since this is a spontaneous chemical reaction, the addition of Al atoms will form an $Al_2O_3$ passivation layer on both Cu metal line and surrounding IMD dielectric material ($SiO_2$ or low-k dielectric containing $SiO_2$). Titanium, aluminum, magnesium, and calcium will have a similar reaction. Deposition of these elements on copper lines having small amount of surface oxide, and on dielectric (particularly on $SiO_2$— based dielectric) to form M2-O containing layers is particularly preferred. It is understood that the discussion above is somewhat simplified, as stoichiometric copper and metal oxides may not be always involved. These bonding metals, however, can be generally used for treating surfaces containing Cu—O bonds of various stoichiometry (which will also be referred to as copper oxide to preserve clarity). These bonding metals can further form M2-O containing layers on a variety of dielectric surfaces which need not necessarily contain $SiO_2$, but which may contain other forms of bound oxygen on their surface (e.g., residual moisture).

Some other metallic oxides have higher free energy of oxide formation than $SiO_2$. For example, these include MnO, ZnO, SnO, NiO, CoO, etc. Addition of these metal atoms onto a copper interconnect structure will also result in formation of M2-O bonds on a copper surface having Cu—O bonds. However, these metals will not be oxidized on the surface of surrounding IMD dielectric if $SiO_2$ based dielectric is used (at least not during formation of the adhesion layer). In these instances the presence of free metal atoms on the dielectric may result in leakage and/or poor time-dependent dielectric breakdown (TDDB). In these cases, a post-treatment to form a non-conductive layer with M2-O, M2-N, M2-C bonds or combinations thereof on the IMD, will be appropriate.

In one embodiment, an inter-layer dielectric layer has a thickness of between about 1,000-10,000 Å. The dielectric layer can include a variety of ILD materials, such as low-k, and ultra low-k dielectrics known to those of skill in the art. For example, carbon-doped silicon oxide, as well as porous and/or organic dielectric materials with k less than about 2.8, such as less than about 2.4 may be used. A copper line (which may include copper alloys) embedded in the dielectric can have a thickness of between about 500-10,000 Å, of which preferably no more than about 10%, more preferably no more than about 2% is occupied by the adhesion layer, as measured by layer thickness. In some embodiments the adhesion layer residing at the top of the copper line is less than about 10 atomic layers thick, such as less than about 5 atomic layers thick. In some embodiments, the adhesion layer has a thickness essentially corresponding to an atomic monolayer of the bonding metal (without counting bonded C, N, or O atoms).

While the adhesion layer in some embodiments, may have graded compositions, in many embodiments the adhesion layer is cleanly segregated at an interface between copper line and the dielectric diffusion barrier layer. The allowable thickness for the adhesion layer will depend on the resistivity of the adhesion layer. In general, the adhesion layer is formed, in accordance with the described methods, such that a resistance shift of a via is less than about 5%, preferably less than about 3%, and even more preferably less than about 1%. The resistance shift is measured as a difference in resistance of an interconnect without a adhesion layer versus a resistance of an interconnect with a adhesion layer. In some embodiments, the allowable resistance shifts, are achieved by forming a adhesion layer with thicknesses not exceeding 20 Å, such as not exceeding 10 Å.

The adhesion layer, generally may include bonding metal in bound or unbound form. In some embodiments, the adhesion layer contains substantially all metal in bound immobilized form, such as in the form that comprises M2-O, M2-N, M2-C bonding or combinations thereof. In some embodiments, M2-O bond is present, and M2 is selected from the group consisting of Al, Ti, Ca, and Mg or from the group consisting of Mn, Zn, Sn, and Co. In some embodiments, the layers with described bonding also reside on top of the inter-layer dielectric, and on top of the partially conductive diffusion barrier (e.g., Ta).

A dielectric diffusion barrier or etch stop layer resides on top of the adhesion layer. The layer, in one embodiment, has a thickness of between about 50-500 Å. Conventionally, silicon nitride, and nitrogen-doped silicon carbide (NDC) are used for this application. Currently, materials with lower dielectric constants than silicon nitride are often used as dielectric diffusion barriers. These materials include carbon-rich silicon carbide materials, such as those described in commonly assigned U.S. patent application Ser. No. 10/869,474 by Yu et al., filed on Jun. 15, 2004; boron-doped silicon carbide materials described in U.S. patent application Ser. No. 10/915,117 by Yu et al., filed on Aug. 9, 2004 and in U.S. patent application Ser. No. 11/373,847 by Yu et al. filed on Mar. 8, 2006; and oxygen-doped silicon carbide materials, e.g., described in U.S. Pat. No. 6,855,645 by Tang et al. issued on Feb. 15, 2005. All patent applications that were mentioned in this paragraph are hereby incorporated by reference for all purposes and in their entireties. In some embodiments the diffusion barrier layer may contain multiple sub-layers, e.g., sub-layers containing doped and/or undoped silicon carbide having different compositions tailored for improved diffusion barrier and etch stop properties. For example, the barrier may include any combination of a sub-layer of undoped carbide, a sub-layer of nitrogen-doped carbide, and a sub-layer of oxygen-doped carbide. The barrier may contain two sub-layers, three sub-layers, or more sub-layers. Examples of combination barrier layers are presented in U.S. patent application Ser. No. 10/869,474, filed Jun. 15, 2004 (now U.S. Pat. No. 7,282,438, Issued on Oct. 16, 2007), which is incorporated herein by reference in its entirety. In general, dielectric diffusion barrier layer may include doped or undoped silicon carbide, silicon nitride or silicon carbonitride.

In some embodiments the following type of bonding exists at the interface between copper and the silicon-containing diffusion barrier layer: O-M2-N—Si, where M2 is selected from the group consisting of Al, Ti, Ca, and Mg or from the group consisting of Mn, Zn, Sn, and Co.

Methods for Forming Adhesion Layer Layers

Bonding metallic atoms (in bound or unbound form) can be added on to the copper interconnect structure by contacting the substrate having an exposed copper surface (in some embodiments having a controlled amount of Cu—O bonds) with one or more precursors containing desired metallic elements. In preferred embodiments the deposition is performed in an absence of plasma in a chemical vapor deposition (CVD) apparatus. The following are some exemplary precursors that can be used.

Aluminum-containing layers can be deposited by contacting the substrate with trialkylaluminum precursors (e.g., trimethylalumium (TMA), triethylalumium (TEA), and triisobutylaluminum (TIBA). Hydride-containing organometallic precursors, such as dimethylaluminumhydride (DMAH) can also be used.

Calcium-containing layers can be formed by contacting the substrate with organometallic calcium-containing precursors, such as calcium bis(2,2,6,6-tetramethyl-3,5-heptanedionate) ($Ca(TMHD)_2$), or other appropriate precursors.

Magnesium-containing layers can be formed by contacting the substrate with organometallic magnesium-containing precursors, such as—bis(cyclopentadienyl)magnesium, bis (ethylcyclopentadienyl)magnesium, bis(pentamethylcyclopentadienyl)magnesium, bis(n-propylcyclopentadienyl) magnesium, or other appropriate precursors.

Titanium-containing layers can be formed by contacting the substrate with organometallic titanium-containing precursors, such as bis(2,4-dimethylpentadienyl)titanium, (methylcyclopentadienyl)Ti(NMe$_2$)$_3$; (ethylcyclopentadienyl)Ti(NMe$_2$)$_3$; (propylcyclopentadienyl)Ti(NMe$_2$)$_3$; (methylcyclopentadienyl)Ti(NEt$_2$)$_3$; (ethylcyclopentadienyl)Ti(NEt$_2$)$_3$; (propylcyclopentadienyl)Ti(NEt$_2$)$_3$; (methylcyclopentadienyl)Ti(NMeEt)$_3$; (ethylcyclopentadienyl)Ti(NMeEt)$_3$; (propylcyclopentadienyl)Ti(NMeEt)$_3$, (Trimethyl)pentamethylcyclopentadienyltitanium, or other appropriate precursors.

To achieve the desired thickness of the adhesion layer without penalties of copper line resistance increase and poor TDDB, one or more of the following controlling methods are used.

In some embodiments, the thickness of the precursor layer is carefully controlled by forming a monolayer or a saturated layer as determined by the thermodynamics of adsorption. For example, in some embodiments the precursor layer thickness is no more than the thickness of the precursor that can be adsorbed by the substrate. Thus, in some embodiments the process is adsorption-controlled, and deposition of uncontrollably large amounts of material is avoided.

In some embodiments, the control over thickness is achieved by controlling the thickness of copper oxide on the copper surface. In this case, the thickness of the adhesion layer will be limited by the reaction between the metal-containing precursor and available copper oxide. Thus, if a controlled small amount of Cu—O bonds is allowed to stay on the surface, the thickness of the M2-O—containing layer may be limited by the amount of Cu—O bonds.

In other embodiments, the thickness of the precursor layer can be controlled by controlling precursor flow rates, substrate exposure times, substrate temperature, or other parameters of deposition process.

In certain embodiments, the precursor layer (which may originally contain unbound metal) is completely converted to a stable oxide, nitride or carbide form on both copper metal lines and surrounding IMD dielectric materials. However, in some embodiments, some or all of the layer remains in the form of a free metal at least over the copper interconnect structures.

Combinations of controlling methods described above may also be used.

Figure 2:
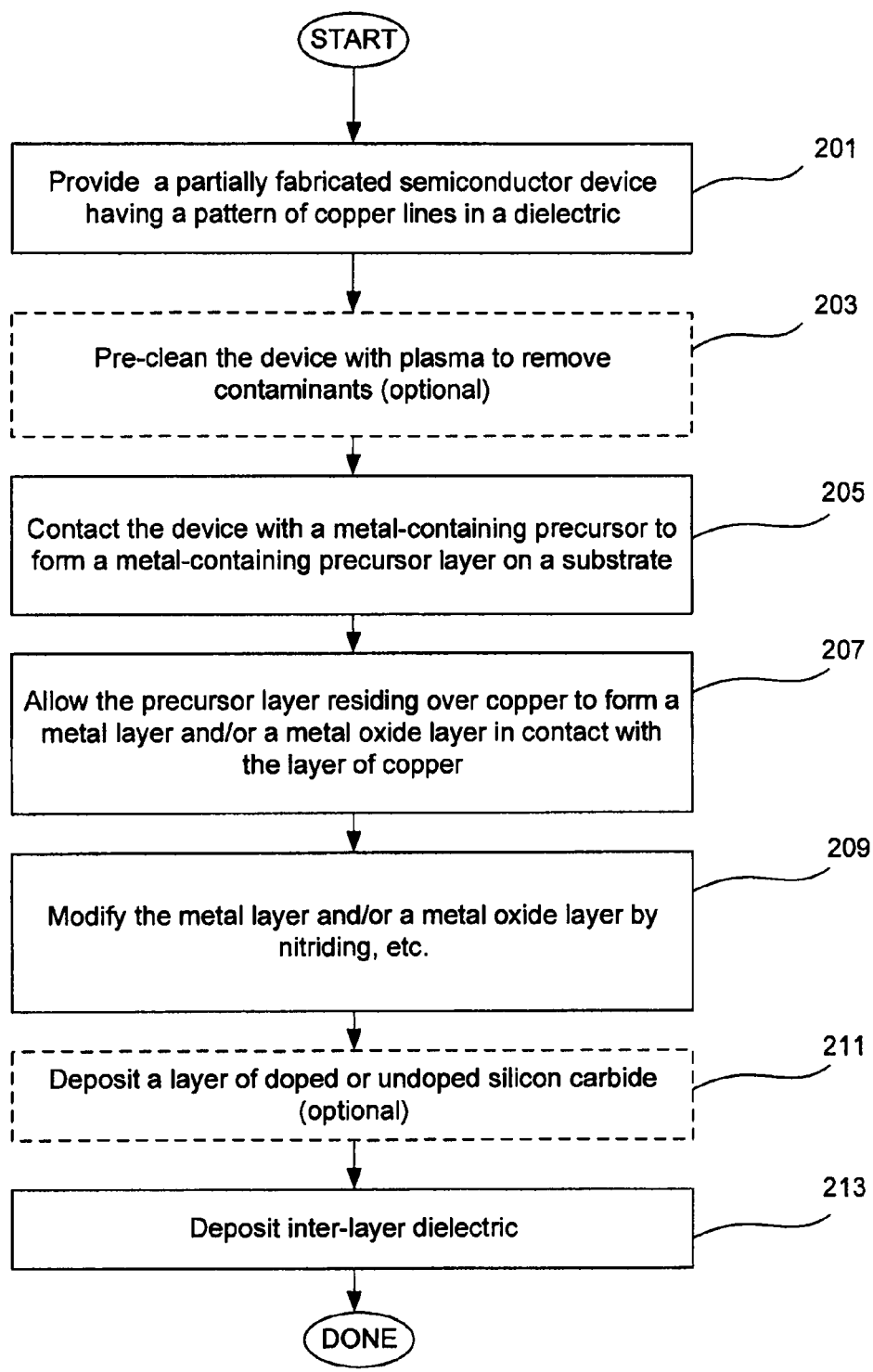
FIG. 2 presents an example process flow diagram of a cap-forming process according to some embodiments.

An exemplary method for forming adhesion layer is illustrated by a process flow diagram shown in FIG. 2. While the methods described herein may be practiced in many types of apparatus, in some embodiments, plasma enhanced chemical vapor deposition (PECVD) apparatus is preferred. In some embodiments, the PECVD apparatus is capable of providing high frequency (HF) and low frequency (LF) plasma generating sources. It is noted, however, that deposition of the metal-containing precursor layer is typically performed in the absence of plasma and can be conducted in any suitable CVD apparatus. Nevertheless, in some embodiments, certain pretreatments or post-treatments may require the use of plasma, and PECVD apparatus may be used to perform portions of the sequence or the entire sequence described herein.

Referring to FIG. 2, the process starts by providing a partially fabricated semiconductor device having a pattern of copper lines in an IMD dielectric, as shown in operation 201. As previously described with reference to FIG. 1A, a thin layer of partially-conductive diffusion barrier material (containing, e.g., Ta, TaN$_x$, TiN$_x$, Ru, W) is residing at the interface between copper and dielectric. A layer of copper and a layer of dielectric are exposed at the substrate surface. Typically, such substrate is obtained after a CMP operation and contains a layer of copper oxide and other contaminants on copper surface.

In those embodiments which rely on controlled reaction of metal-containing precursor with Cu—O bonds, the preparation of copper surface is of particular importance. In other embodiments, it may be less critical.

Generally, the substrate is optionally pre-cleaned in an operation 203 to remove contaminants from its surface. For example, the substrate may be pre-cleaned by exposing it to a reducing gas in a plasma (e.g., a gas selected from the group consisting of H$_2$, N$_2$, NH$_3$ and mixtures thereof in a plasma discharge) in order to remove some or all of the copper oxide from copper surface. In some embodiments pre-cleaning with H$_2$ plasma has provided devices with particularly improved characteristics. The process gas during pre-clean can also include a carrier gas, such He, Ar, etc. In one example, pre-clean is performed in a PECVD chamber at a temperature of about 200-400° C., pressure of about 1.5-4 Torr and an H$_2$ flow rate of about 4,000-10,000 sccm. The plasma, which may contain an HF and an LF component is ignited and is sustained at a total power of 200-1000 W per one 300 mm wafer. In some embodiments, it is preferable to use HF power at 0.1-1.5 W/cm$^2$ and LF power at 0-0.8 W/cm$^2$ during the pre-clean operation. In another example, NH$_3$ is used instead of H$_2$ as a reducing gas, and is flowed into the process chamber at a flow rate ranging from about 6,000 to 8,000 sccm. An N$_2$ carrier gas is flowed into the chamber at a flow rate of about 2,000-4,000 sccm. The pre-cleaning treatment can last several seconds, e.g., between about 6-20 seconds.

In some embodiments, the pre-clean is performed such as not to completely remove copper oxide, but so as to leave about a monolayer of Cu—O bonds on copper surface. This monolayer is required for subsequent formation of M2-O bonds, in those embodiments which make use of metal oxidation upon deposition. Preferably, no more than 10 Å of Cu—O layer should remain on the surface in those embodiments. The controlled copper oxide removal can be achieved by controlling plasma conditions, as well as duration of the pre-clean.

In some embodiments, it is preferable to perform pre-clean using more mild methods than direct plasma exposure. These milder methods are particularly advantageous when copper lines are embedded in delicate ULK dielectrics that can be easily damaged by direct plasma exposure.

In some embodiments, complete or partial removal of copper oxide is performed by using a remote plasma comprising a gas selected from a group consisting of H$_2$, N$_2$, NH$_3$ and mixtures thereof. In this implementation, one or more of these gases (e.g., a mixture of H$_2$ and N$_2$ or a mixture of NH$_3$ and N$_2$) are used to form a plasma in a chamber that is physically separated from the chamber holding the wafer substrate. The formed plasma is then directed through a delivery line to an ion filter, which depletes the plasma of ions, while leaving the radicals. The resulting radical-rich process gas is delivered through an inlet (e.g., a showerhead) to the chamber housing the substrate. The radical-rich process gas (which in some embodiments contains little or substantially no ionic species) contacts the substrate surface and removes copper oxide, either partially or completely as desired. Because high energy ions contained in direct plasma have been implicated in dielectric damage, the use of ion-poor remote plasma provides a mild and effective way of conducting a pre-clean. Suitable examples remote plasma systems are found in the Gamma™ line of products provided by Novellus Systems of San Jose, Calif.

In other embodiments, complete or partial removal of copper oxide is performed by using a ultraviolet (UV) radiation treatment in a presence of a reducing gas, such as a gas selected from a group consisting of $H_2$, $N_2$, $NH_3$ and mixtures thereof. In this implementation, one or more of these gases (e.g., a mixture of $H_2$ and $N_2$ or a mixture of $NH_3$ and $N_2$) contact the substrate, while the substrate is irradiated with UV light. For example, an apparatus and process conditions such as described in commonly owned Provisional Patent Application Ser. No. 61/260,789 filed on Nov. 12, 2009, titled "UV and Reducing Treatment for K Recovery and surface Clean in Semiconductor Processing" by B. Varadarajan et al., which is herein incorporated by reference in its entirety for the purpose of providing details of an apparatus and methods of a UV treatment that are suitable for use in embodiments described herein. Described UV treatment can be used for controllable removal of copper oxide, where the thickness of removed oxide can be controlled by duration of UV exposure, process gas composition, substrate temperature, and other conditions.

In some embodiments pre-clean is accomplished by thermal treatment in a plasma-free environment. For example, the wafer may be heated to a temperature of at least about 200° C. for about 15 to 60 seconds in an atmosphere comprising $H_2$, $N_2$, $NH_3$, $N_2$ or mixtures thereof. Such thermal treatment may be used for partial copper oxide removal, and is particularly advantageous for treating substrates containing delicate ULK dielectrics.

In some embodiments, instead of controllably removing copper oxide to a desired thickness, it may be more efficient to completely remove copper oxide from copper surface and then controllably grow a desired amount of Cu—O bonds on copper surface (e.g., 10 Å or less). The complete removal can be performed by direct plasma treatment, remote plasma treatment, thermal treatment or UV treatment in a reducing environment, as described above, while conditions are adjusted for removal of the entire oxide layer. The growth of controlled amount of Cu—O bonds can then be implemented by exposing oxygen-free copper surface to a rigorously controlled dose of an oxygen-containing gas, such as $O_2$, $H_2O$, $CO_2$, $N_2O$ or mixtures thereof in a controlled conditions such as temperature, pressure, time, etc. Such growth may be accomplished with or without the assistance of plasma.

After the pre-clean is completed, a precursor layer of metal-containing material (containing bound and/or unbound metal) is deposited onto the substrate surface in operation 205. Advantageously, the metal-containing material does not need to selectively deposit onto the metal surface, and may be deposited both onto the surface of dielectric and onto metal, although in some embodiments it selectively deposits on the copper surface. The precursor layer is deposited by contacting the partially fabricated device with a precursor (e.g., with a metal-containing reactant) under conditions that result in a deposition of a metal-containing precursor layer.

In one embodiment, the metal-containing precursor layer is deposited thermally without a plasma discharge. For example, a volatile precursor, such as a volatile hydride, halide, carbonyl, or an organometallic compound can react (e.g., decompose) at high temperature to deposit a layer of metal-containing material on a substrate surface. In some embodiments, the precursor reacts with surface oxygen both on copper surface and on the dielectric to form M2-O bonds. In other embodiments both deposition of free metal and M2-O bond formation may occur. The temperature range, the substrate exposure time, and other deposition conditions are tuned for each particular precursor to achieve desired result, as will be understood by those of skill in the art. For example, in some embodiments, the temperature range for deposition of Al-containing layer from TMA precursor on a copper surface containing an atomic layer of copper oxide, is selected such that essentially no free aluminum is deposited, while formation of Al—O bonds on copper surface readily occurs. Such reaction regime occurs at substrate temperatures of between about 80-350° C. In other embodiments the temperature regime may be adjusted such as free aluminum metal is deposited onto copper, where copper surface is preferably completely oxygen-free. This reaction regime is typically implemented at substrate temperatures of at least about 400° C.

In one example, a volatile metal-containing precursor is introduced into the chamber. Organometallic compounds, metal hydrides, metal halides, and metal carbonyls may serve as suitable precursors. For example, alkyl-substituted metal derivatives and cyclopentadienyl-substituted metal derivatives may be used. The precursor reacts at high temperature to form a metal-containing precursor layer on a substrate. In general, depending on the nature of the precursor, the deposition conditions are optimized to deposit the metal-containing source layer with the desired qualities. For example, the temperature range may be optimized to favor a particular decomposition mechanism for a precursor, and thereby tuning the composition of metal-containing source layer, as desired.

As mentioned, a variety of metals can serve as bonding agent. For example Al, Ti, Ca, and/or Mg as well as their combinations may be used. Other metals meeting the criteria set forth herein, for which volatile precursors are known, may be used. Examples of precursors have been previously listed above. In some embodiments aluminum-containing precursor is selected from the group consisting of trimethylaluminum, dimethylaluminum hydride, triethylaluminum, triisobutylaluminum, and tris(diethylamino)aluminum. Examples of precursors that can be used for depositing source layers containing titanium in some embodiments include but are not limited to tetrakis(dimethylamino)titanium (TDMAT), tetrakis(diethylamino)titanium (TDEAT), tetrakis (ethylmethylamido)titanium, and bis(diethylamino)bis(diisopropylamino)titanium.

As it was mentioned above, the precursor layer does not necessarily need to contain pure elemental metal, but may include compounds of metal with other elements, e.g., H, C, N, O, etc.

As mentioned, the precursor layer does not need to be selectively deposited exclusively on top of the copper line, but may be deposited both on top of the dielectric layer and on top of copper. In many embodiments, however, some degree of selectivity between copper and the dielectric is achieved, and a thicker precursor layer may be formed over the copper line. It is understood, that depending on particular precursor and deposition conditions, a wide variety of selectivities may be achieved ranging from an entirely selective deposition of the precursor layer onto copper line, to an entirely non-selective process where the precursor layer is deposited to an equal thickness on both copper and dielectric. Typically, when trialkylaluminum is used as a precursor, the deposition is non-selective due to facile formation of Al—O bonds on contact with the dielectric.

Referring again to the process flow diagram shown in FIG. 2, after the precursor layer has been formed in operation 205, in a subsequent operation, 207, the precursor layer is allowed to form a metal or metal oxide layer. This may take place spontaneously, when for example, an organometallic precursor decomposes on the substrate surface to form a metal layer or when organometallic compound reacts with Cu—O bonds. In some embodiments, the reaction occurs immediately, while for some precursors or reaction conditions, a certain period of time is needed for the adsorbed precursor to react.

A subsequent modification or passivation operation 209 may serve the following purposes. First, if free metal is present in the precursor layer, it may help control the interconnect resistance, by converting the metal to an immobile form, e.g., to a form containing M2-O, M2-C, M2-N bonds or combinations thereof. Preferably, the passivated layer contains materials which cannot easily diffuse from the passivated material into copper line. For example, free aluminum may be converted to aluminum oxide, nitride, etc. While free aluminum is capable of diffusing into copper line, when converted to nitrides and oxides, these materials are trapped within the passivated layer, and are not capable of entering the copper line and increasing its resistivity. Because the metal or metal oxide layer is modified in this post-treatment step, the amount of metal introduced into copper line is limited or reduced to zero.

Post-treatment may also be beneficial in those embodiments where the precursor layer contains conductive materials that are deposited both over copper and dielectric. In these embodiments, passivation converts the conductive material (e.g., metal) to a material with little or no conductivity, thereby preventing shorting between adjacent copper lines. For example, a precursor layer containing free metal M2 on a layer of dielectric can be converted to a non-conductive material containing M2-O, M2-N, M2-C bonds or combinations thereof.

In some embodiments post-treatment is performed in order to remove residual organic groups (e.g., alkyl groups) from the precursor layer. For example treatment with $H_2$ may be used to remove organic groups and to form M2-H bonds. Treatment with $NH_3$, $N_2$ and mixtures thereof may be used to form M2-N bonds. These treatments are particularly desired, when the precursor layer contains little or no free metal but contains residual organic bonds.

In general a variety of post-treatments for the precursor layer are possible, which can be selected depending on the nature of the precursor layer (e.g., absence or presence of free metal, residual alkyl groups, etc.), the nature of metals used, the chemistry of ILD layer, and the nature of dielectric diffusion barrier layer.

In some embodiments, post-treatment involves direct plasma treatment. For example, the substrate having exposed precursor layer may be treated with a plasma formed in a process gas selected from the group consisting of $H_2$, $N_2$, $NH_3$ and mixtures thereof. In some embodiments, the substrate having a precursor layer is treated with $H_2$ in a plasma. Hydrogen plasma treatment can serve to remove residual organic groups from the precursor layer, and to form terminal M2-H bonds. In other examples the substrate is post-treated with a mixture of $H_2$ and $N_2$ in a plasma or with $NH_3$ in a plasma, which results in removal of organic groups and in formation of M2-N bonds. Other nitridizing agents, such as $N_2H_4$ and amines may be used in some embodiments.

As is the case with pre-treatment, it is sometimes desirable to use milder treatment methods than direct plasma treatment. For example, in some embodiments the substrate may be treated using remote plasma formed in a gas selected from the group consisting of $H_2$, $N_2$, $NH_3$ and mixtures thereof. As previously described, remote plasma is generated in a chamber that is physically separated from the chamber housing the substrate, and is depleted of ionic species, before it is delivered to the substrate, which leads to lower probability of dielectric damage. This is because radicals contained in remote plasma are typically less damaging than high-energy ions. M2-H, and M2-N bonds, as well as removal of organic groups from the layer can be achieved by remote plasma.

Further, mild post-treatment can be performed by UV irradiation in a process gas selected from the group consisting of $H_2$, $N_2$, $NH_3$ and mixtures thereof, using methods described in U.S. Provisional Application Ser. No. 61/260,789 which was previously incorporated by reference. Such UV treatment can be used to form M2-H, and M2-N bonds, as well as to remove organic substituents from the precursor layer.

In some embodiments post-treatment is accomplished by thermal treatment in a plasma-free environment. For example, the wafer may be heated to a temperature of at least about 300 to 350° C. in an atmosphere comprising $H_2$, $N_2$, $NH_3$, or mixtures thereof. Such thermal treatment is particularly advantageous for treating substrates containing delicate ULK dielectrics.

Remote plasma post-treatment, thermal post-treatment, and UV post-treatment are particularly advantageous when ULK dielectrics, particularly easily damaged porous and organic dielectrics are used in the ILD layer.

While nitridizing post-treatment is preferred in many embodiments, in some embodiments other types of post-treatment may be used.

For example oxidizing post-treatment to form M2-O bonds may be implemented by contacting the substrate having exposed precursor layer to an oxygen-containing gas (such as $O_2$, $CO_2$, $N_2O$, etc) in a plasma. In other embodiments, M2-C bonds are formed in the post-treatment step, for example, by treating the precursor layer with a hydrocarbon in a plasma. M2-S, M2-Se, M2-Te, and M2-P can be formed in post-treatment step by exposing the substrate to a reactant containing a required element, e.g., $H_2S$, $H_2Se$, $H_2Te$, $PH_3$, respectively, with or without a plasma. Both direct plasma and remote plasma can be used for these types of post-treatments.

Upon formation of the adhesion layer, a layer of doped or undoped silicon carbide is deposited in an operation 211. The layer of silicon carbide serves as an etch stop or a dielectric diffusion barrier layer and is typically deposited to a thickness of about 100-500 Å. The layer of silicon carbide can be deposited by CVD (preferably by PECVD), for example, by exposing the substrate to silicon-containing and carbon-containing precursors in a plasma discharge. For example, silane, alkylsilanes, and hydrocarbons may be used as precursors. When doped silicon carbide is deposited, the dopant-containing precursor is additionally introduced into the process chamber. For example, $CO_2$, $O_2$ or $N_2O$ may be added during deposition of oxygen-containing silicon carbide, $B_2H_6$ may be added to deposit boron-doped silicon carbide, $NH_3$ and $N_2$ may be added to deposit nitrogen-doped silicon carbide, etc. In other embodiments, doped or undoped silicon nitride or silicon carbonitride is deposited on top of the metal-containing adhesion layer to serve as an etch stop or diffusion barrier layer. Deposition of silicon nitride can be performed by PECVD using a silicon-containing precursor (e.g., silane) and a nitrogen-containing precursor (e.g., ammonia). Silicon carbonitride can be deposited by PECVD using a precursor or precursors containing carbon, silicon, and nitrogen, e.g., using a mixture of organosilane and ammonia.

It is noted that in some cases, deposition of a dielectric diffusion barrier or an etch stop layer is optional, because the adhesion layer (formed with or without post-treatment) may have suitable properties to serve as a diffusion barrier or an etch stop. For example, an adhesion layer containing certain metal oxides or nitrides may serve as a diffusion barrier layer, eliminating the need for deposition of a separate silicon carbide layer.

The process depicted in FIG. 2 proceeds to a subsequent operation 213, in which an inter-layer dielectric (such as silicon dioxide, organosilicon glass, a porous organic dielectric, etc.) is deposited. The dielectric is deposited either onto the diffusion barrier or an etch stop layer (e.g., onto a silicon carbide layer) or directly onto the adhesion layer, if the adhesion material has adequate properties for serving as a diffusion barrier. The dielectric can be deposited by PECVD or by spin-on methods and is typically deposited to a thickness of between about 3,000-10,000 Å. The Damascene process may then follow further as depicted in FIGS. 1C-1E.

It is understood, that a process illustrated by the flow diagram shown in FIG. 2 is exemplary only, and that various modifications of this process may be implemented, depending on specific metals and precursors in use.

Figure 3:
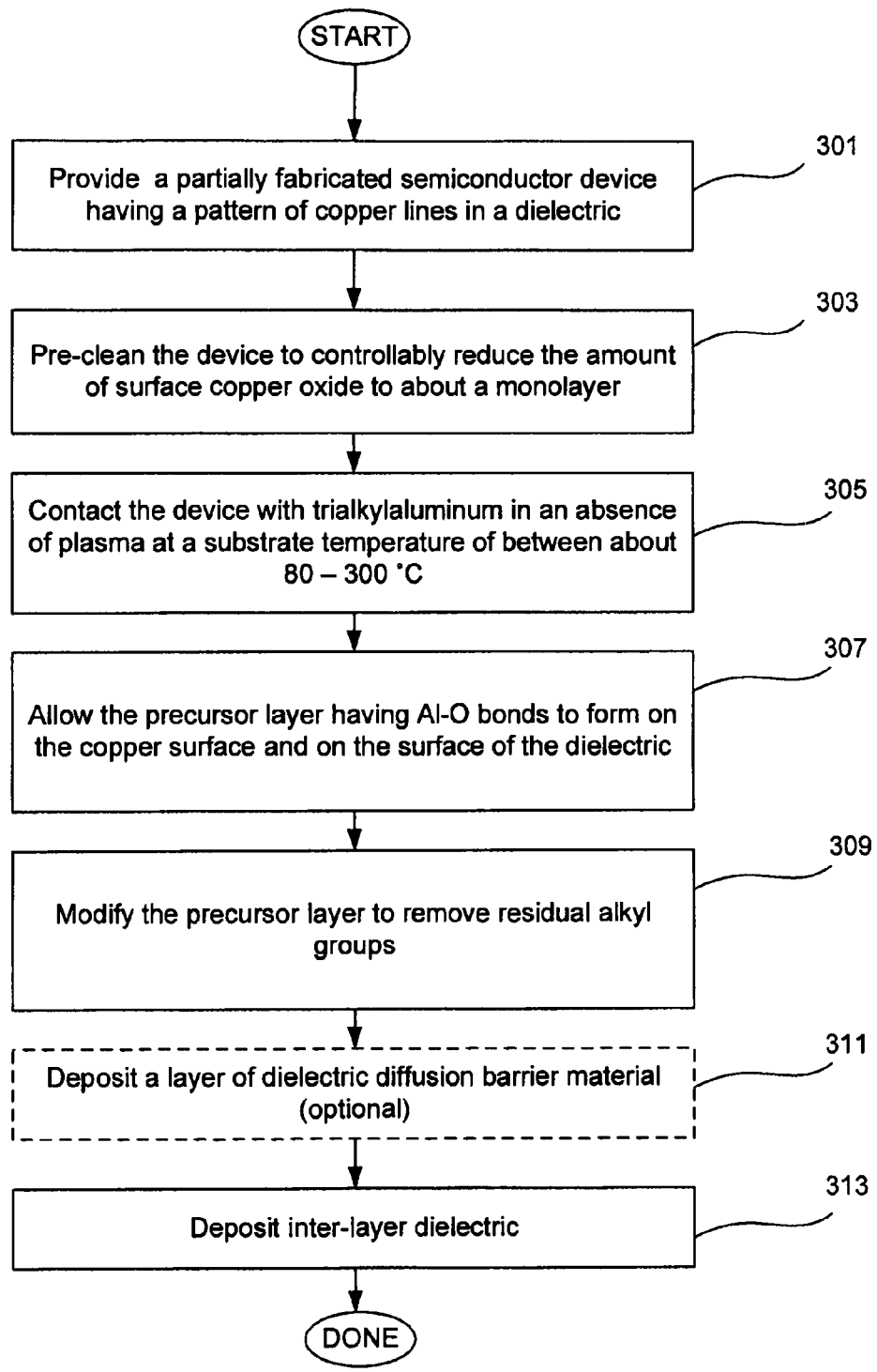
FIG. 3 presents an example process flow diagram of a cap-forming process using trialkylaluminum precursor on a copper surface having a controlled amount of copper oxide.

One of more specific examples of the capping process is described in the process flow diagram shown in FIG. 3. This process uses a trialkylaluminum precursor to form a nearly atomic adhesion layer, which resides both on copper surface and on the dielectric, where the deposition relies on the presence of a thin layer of copper oxide on the copper surface.

Referring to FIG. 3, the process starts in 301 by providing a partially fabricated semiconductor device having a pattern of copper lines in a dielectric, e.g., in a ULK dielectric. The copper surface in the provided substrate will have a layer of copper oxide, which always forms when the substrate is exposed to ambient atmosphere (e.g., during CMP copper overburden removal). In addition to exposed copper and dielectric, the substrate will typically have some exposed partially conductive diffusion barrier material (e.g., Ta, TaN, etc.) at an interface between copper and dielectric. The diffusion barrier material will also typically have a thin layer of oxide on its surface.

In operation 303 the device is pre-cleaned to controllably reduce the amount of surface copper oxide to about a monolayer. While in general, such pre-clean is not absolutely required, and any amount of residual copper oxide can be used in a subsequent reaction with aluminum precursor, it is highly preferable to reduce the amount of surface oxide to about a monolayer (e.g., to no more than 10 Å), so that an extremely thin aluminum-containing adhesion layer (preferable about an atomic monolayer of aluminum) is formed in a controlled fashion. Therefore, in some embodiments particular care is taken during surface preparation of copper. As mentioned above, direct plasma treatment, remote plasma treatment, thermal treatment, and UV treatment in a reducing gas can be used to controllably remove copper oxide. Complete removal of copper oxide is not desired in this pre-clean, because oxygen-free copper surface will react with a trialkylaluminum precursor following a different mechanism. In some embodiments, copper oxide is completely removed, and is then controllably re-grown to about one atomic monolayer of Cu—O bonds.

After the surface has been prepared in 303, the substrate is contacted with trialkylaluminum (e.g., TMA) in an absence of plasma at a substrate temperature of between about 80-350° C. Importantly, after the pre-clean, the substrate is maintained in a reducing atmosphere, and any exposure to oxygen is avoided to preserve the pre-treated copper surface having a controlled amount of Cu—O bonds. The trialkylaluminum under described conditions will react with the substrate in a self-limiting fashion, and will form a precursor monolayer having O—Al—CH$_3$ bonding on the copper. The precursor will also form a layer comprising Al—O bonds on the exposed dielectric and on diffusion barrier (e.g., Ta) layers, as shown in 307. It is noted that the choice of substrate temperature is very important for this reaction, as at higher temperatures, particularly at temperatures of 400° C. and higher, the precursor forms free aluminum metal, which is more difficult to control than the surface-controlled reaction described above. Further free aluminum metal is more mobile than oxygen-bond aluminum and may diffuse into copper line and increase interconnect resistance. While in general, precursor layers described herein may contain unbound metal, in this specific embodiment, it is preferred that substantially all of the metal in the layer is oxygen-bound. This is achieved by using an oxide-containing copper surface and lower substrate temperature of between about 80-350° C. A more preferred temperature range for deposition of this layer is between about 180-350° C. Because plasma is not used in this reaction (to ensure controlled surface-based formation of thin layer), any suitable type of CVD process chamber (not necessarily PECVD process chamber) may be used for this reaction. An inert gas (such as Ar, He, etc.) or certain gas mixtures can be used as a carrier gas.

Figure 4:
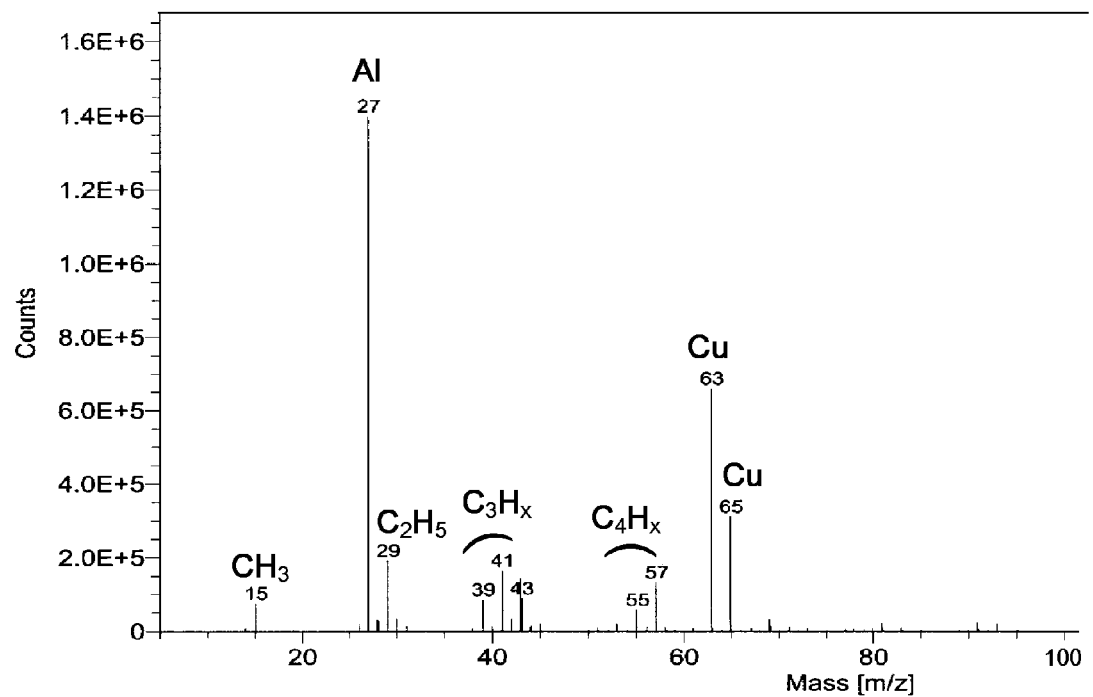
FIG. 4 is an experimental plot showing results of a TOF-SIMS analysis of tetramethylaluminum-treated copper surface.

FIG. 4 provides a TOF-SIMS plot of a layer obtained after treatment of copper surface with TMA. It can be seen that aluminum, as well as organic moieties are present in the formed precursor layer.

Referring again to FIG. 3, the process follows in 309, by modifying the precursor layer to remove residual alkyl groups. Preferably, the post-treatment performed in 309 is used to form Cu—O—Al—H and/or Cu—O—Al—N bonding in the precursor layer. A variety of post-treatments described above including direct plasma post-treatment, remote plasma post-treatment, thermal post-treatment, and UV post-treatment using a gas selected from the group consisting of H$_2$, NH$_3$, N$_2$ and mixtures thereof, can be used. Prior to post-treatment the trialkylaluminum precursor is removed from the process chamber, e.g., by purging, and the substrate is subjected to post-treatment conditions. An example of the post-treatment uses NH$_3$ flow between about 100 to 10000 sccm, N$_2$ flow between about 100 to 1000 sccm and H$_2$ flow between about 100 to 10000 sccm and total RF power between about 100 to 3000 W.

Other types of post-treatment mentioned above may be also used in this embodiment, however nitridizing post-treatment is particularly advantageous due to strong Cu—O—Al—N—Si interface which is formed upon deposition of dielectric diffusion barrier.

In operation 311, a layer of dielectric diffusion barrier layer material (e.g., doped or undoped SiC, SiN, or SiCN) is deposited, typically by PECVD. As a result, a very strong Cu—O—Al—N—Si interface is formed (if nitridizing post-treatment was used) at the interface between copper line and the dielectric diffusion barrier layer, resulting in improved adhesion and better electromigration performance. Finally, in operation 313 a new ILD dielectric layer is deposited onto the dielectric diffusion barrier layer.

In many embodiments it is preferable that the substrate is maintained in a reducing atmosphere (e.g., without traces of oxygen-containing species) throughout pre-treatment, trialkylaluminum soak, post-treatment and any intermediate processes (e.g., during wafer transfer between these processes).

The process described in FIG. 3 provides an extremely thin adhesion layer (usually 1-3, preferably about 1 atomic monolayer of aluminum atoms), which contains immobilized aluminum in Al—O bound form at the top of copper line. Further, in some embodiments, the layer has strong O—Al—N—Si bonding with the dielectric diffusion barrier layer. Because of the small thickness of the adhesion layer and because of immobility of bound aluminum interconnects with such adhesion layers do not exhibit large increases in resistance (e.g., as compared with interconnects with large amounts of diffusing dopants or thick caps).

Apparatus

In general, formation of adhesion layers can be performed in any type of apparatus which allows for introduction of volatile precursors, and is configured to provide control over reaction conditions, e.g., chamber temperature, precursor flow rates, exposure times, etc. In some embodiments, pre-clean, the precursor treatment, capping layer post-treatment, and dielectric diffusion barrier deposition are all performed without exposing the substrate to ambient environment, in order to prevent inadvertent oxidation and contamination of the substrate. In one embodiment, these operations are performed sequentially in one module without breaking the vacuum. In some embodiments, the operations are performed in one CVD (preferably PECVD) apparatus having multiple stations within one chamber, or having multiple chambers. VECTOR™ PECVD apparatus available from Novellus Systems, Inc of San Jose, Calif. is an example of a suitable apparatus.

An exemplary apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing the metal precursor layer and etch stop layer deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD system may be used. In even more preferred embodiments the PECVD system includes a LF RF power source.

Figure 5:
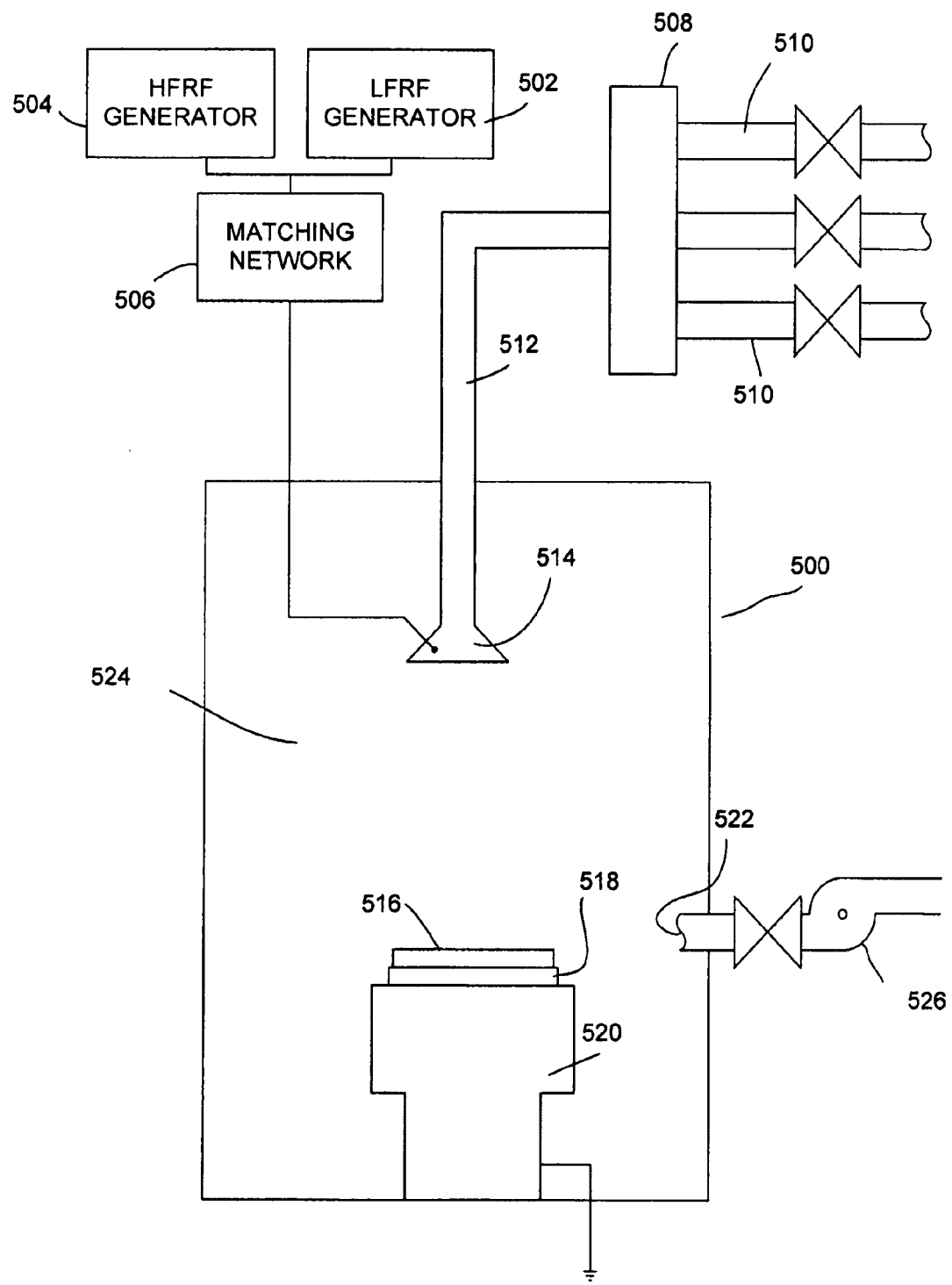
FIG. 5 is a schematic presentation of a PECVD process chamber suitable for forming capping layers in accordance with some embodiments described herein.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and a low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the pre-cleaning, formation of the precursor layer and formation of the adhesion layer and of the process. In embodiments employing chemical precursor(s) delivered in the liquid form, liquid flow control mechanisms are employed. The liquid is vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 6:
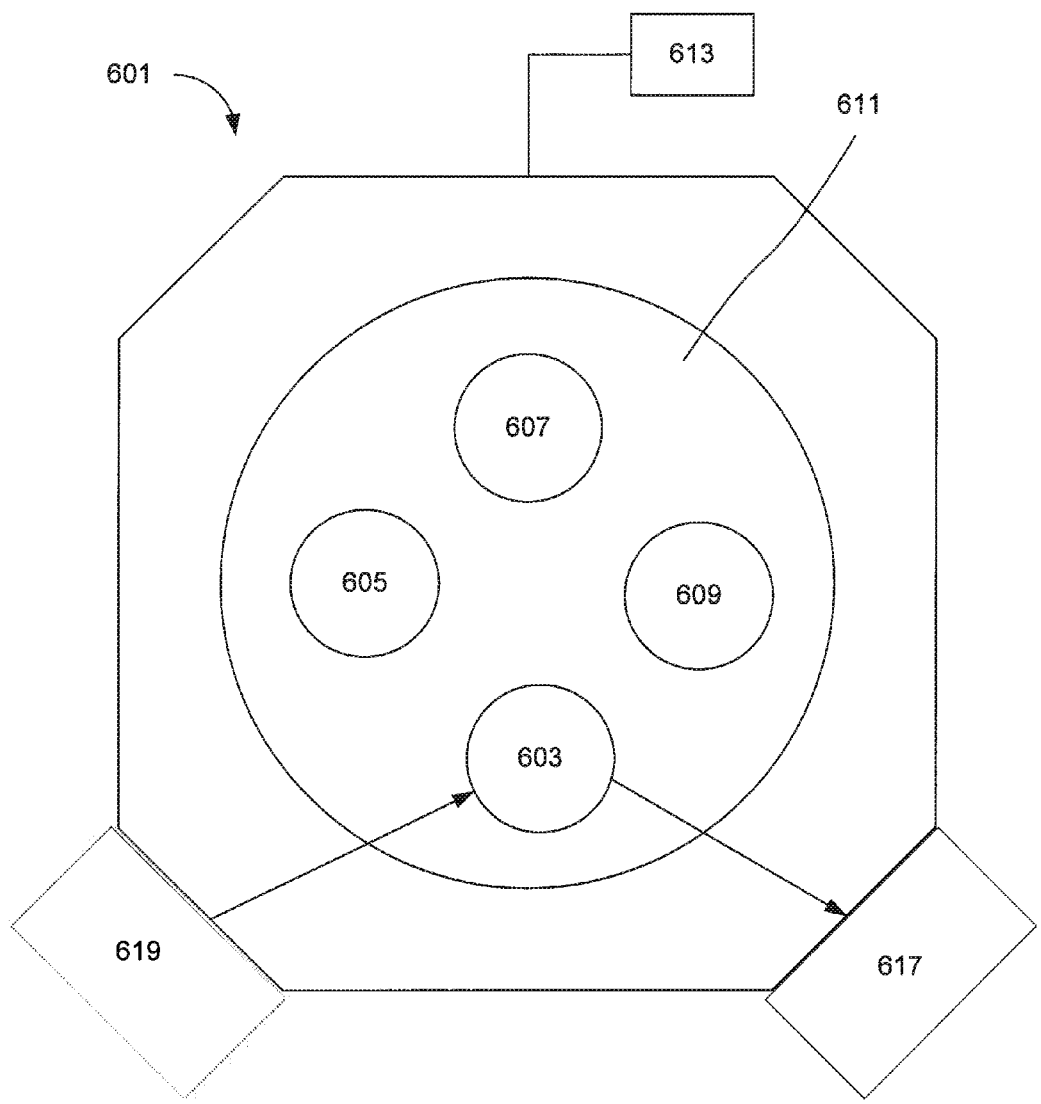
FIG. 6 is a schematic presentation of an exemplary multi-station apparatus suitable for semiconductor processing according to embodiments described herein.

In one of the embodiments a multi-station apparatus may be used for forming a capping layer and a diffusion barrier. The multi-station reactor allows one to run different processes concurrently in one chamber environment, thereby increasing the efficiency of wafer processing. One example of such an apparatus is depicted in FIG. 6. A schematic presentation of top view is shown. An apparatus chamber 601 comprises four stations 603-609 and two loadlocks, an entry loadlock 619 and an exit loadlock 617. In other embodiments, a single loadlock can be employed for both entry and exit of wafers. In general, any number of stations is possible within the single chamber of a multi-station apparatus. Station 603 is used for loading and unloading of the substrate wafers. Stations 603-609 may have the same or different functions. For example, some of the stations may be devoted to formation of adhesion layers, while other stations may be used for depositing the dielectric diffusion barrier film. Further, some stations may be devoted to copper oxide reduction.

In one of the embodiments, individual stations can operate under distinct process conditions and may be substantially isolated from each other. For example one station may operate under one temperature regime, while another may operate under a different temperature regime.

In one embodiment, pre-cleaning operation, deposition of the metal precursor layer, and formation post-treatment are performed in one preferred temperature regime and are carried out in one station of the multi-station apparatus. The deposition of a dielectric diffusion barrier may require a different temperature regime in some embodiments, and may be carried out in a different station or stations. In some embodiments, the entire capping process including pre-treatment, formation of the precursor layer and post-treatment is performed in one station of a single station or a multi-station apparatus. In some embodiments, deposition of a dielectric diffusion barrier layer may be also performed at the same station as the capping operation. In other embodiments dielectric diffusion barrier may be deposited in a different station or even in a different apparatus altogether. In some cases, the entry loadlock 619 can be used to pre-clean or otherwise pretreat the wafer. This may involve oxide remove by, e.g., chemical reduction.

In one example, station 603 may be devoted to pre-clean and to formation of the adhesion layer (from the precursor layer and passivated layer). Station 603 may operate at a temperature range of about 200-300° C., which is preferred in some embodiments for both capping and pre-clean operation. Deposition of dielectric diffusion barrier material, such as silicon carbide, can be carried out in stations 605, 607, and 609 at a temperature range of about 350 to 400° C., which is a preferred process temperature according in some silicon carbide deposition processes.

Advantageously, pre-clean, deposition of the precursor layer and post-treatment, may require similar conditions in some embodiments, and can be performed at one station 603.

According to an embodiment described above, station 603 is a pre-clean station and a adhesion layer formation station. Stations 605, 607, and 609 may all serve for deposition of dielectric diffusion barrier layer. An indexing plate 611 is used to lift the substrates off the pedestals and to accurately position the substrates at the next processing station. After the wafer substrate is loaded at station 603 and subject to any processing (e.g., pre-clean and capping including precursor layer deposition and passivation) there, it is indexed to station 605, where capping and/or dielectric deposition is performed. The wafer is then moved to station 607 where deposition of diffusion barrier dielectric is started or continued. The substrate is further indexed to station 609, where further deposition of barrier dielectric is performed, and then indexed to station 603 where it is unloaded at station 603, and the module is charged with a new wafer. During normal operation, a separate substrate occupies each station and each time the process is repeated the substrates are moved to new stations. Thus, an apparatus having four stations 603, 605, 607, and 609 allows simultaneous processing of four wafers, wherein at least one station performs a process that is different from the processes performed at other stations. Alternatively, four wafers may be subjected to identical operations at all four stations, without dedicating certain stations to deposition of a particular layer.

A few specific examples of station-to-station process sequences will now be provided. In a first example, an entry loadlock performs pretreatment (e.g., reduction of copper oxide). Then the first station of the apparatus (e.g., station 603 or a plurality of first stations sequentially arranged) forms the adhesion layer (by, e.g., exposure to a precursor such as TMA). A second station (e.g., station 605 in FIG. 6) then performs a post-treatment such as passivation (e.g., exposure to nitrogen, ammonia, and/or hydrogen as described herein). The remaining stations (e.g., stations 607 and 609) in the apparatus then perform diffusion barrier formation.

In another example, the first station (e.g., station 603) performs pretreatment, the second station (e.g., station 605 or a series of sequential stations) performs both formation of the adhesion layer and post treatment (e.g., passivation), and the remaining stations perform dielectric diffusion barrier layer deposition. In yet another example, the first station performs pretreatment, adhesion layer deposition, and post-treatment. The remaining stations perform diffusion barrier formation.

The process conditions and the process flow itself can be controlled by a controller unit 613 which comprises program instructions for monitoring, maintaining and/or adjusting certain process variables, such as HF and LF power, gas flow rates and times, temperature, pressure and the like. For example, instructions specifying flow rates of metal precursor and ammonia for precursor layer deposition and post-treatment may be included. The instructions may specify all of the parameters to perform operations, according to methods described above. For example, instructions may include parameters for pre-clean, precursor layer deposition, formation of the post-treated adhesion layer, and for dielectric diffusion barrier deposition. The controller may comprise different or identical instructions for different apparatus stations, thus allowing the apparatus stations to operate either independently or synchronously.

Figure 7:
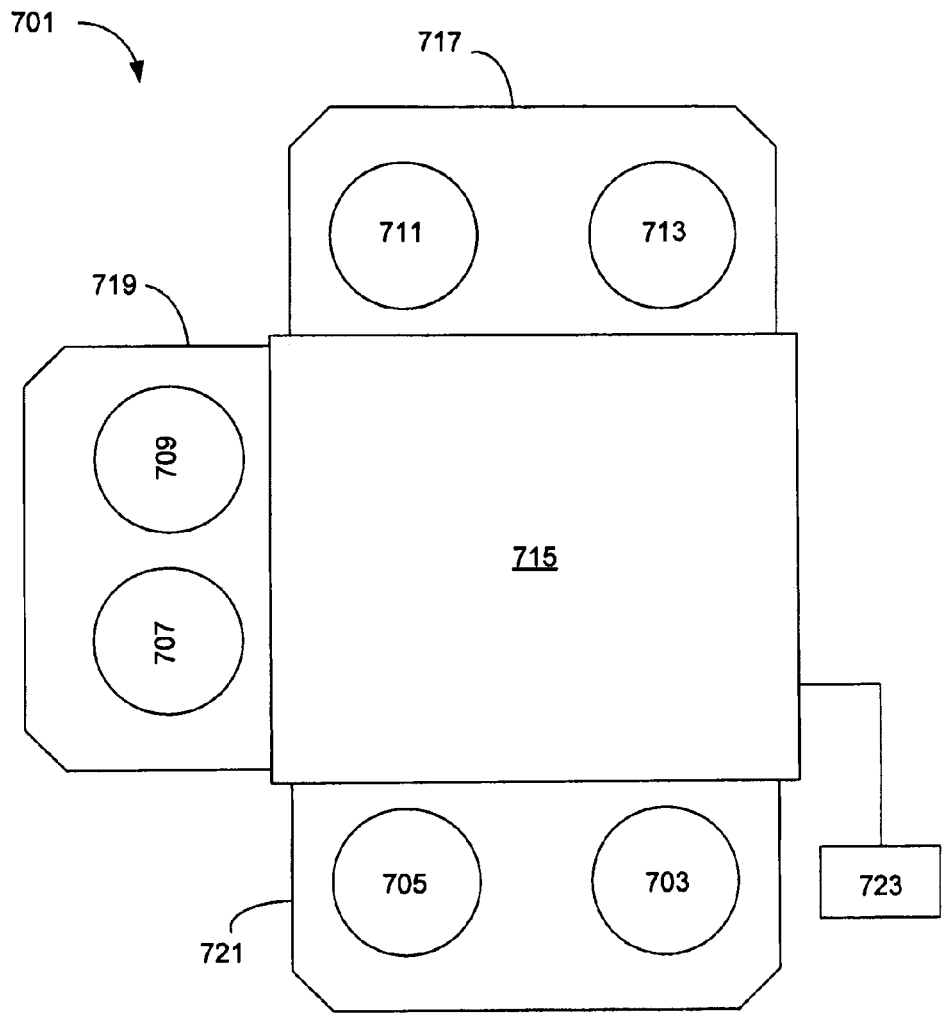
FIG. 7 is a schematic presentation of another example of a multi-station apparatus suitable for semiconductor processing according to embodiments described herein.

Another example of a multi-station apparatus is illustrated in FIG. 7. The multi-station apparatus 701 includes six stations 703, 705, 707, 709, 711, and 713 residing in three separate processing chambers 717, 719, and 721, with two stations residing in each chamber. A robot-containing chamber 715 adjacent chambers 717, 719, and 721 provides mechanism for loading and unloading the wafers into the stations. A controller 723 provides instructions for operation of a multi-station apparatus 701. Individual stations within one chamber are isolatable from each other and may carry out identical or different operations. In one embodiment, two wafers are simultaneously transferred to stations 703 and 705 residing in one chamber 721 and simultaneously undergo identical operations including pre-clean, precursor layer deposition and formation of post-treated layer. After this process is completed, the two wafers are removed from the chamber 721, and are simultaneously introduced to stations 707 and 709 residing in chamber 709. In this chamber, a diffusion barrier material layer is simultaneously deposited. The wafers are then removed from chamber 719, and are introduced to stations 711 and 713 residing in chamber 717, where further processing follows. In some embodiments, formation of adhesion layer may be performed in a multi-chamber apparatus with different subprocesses (e.g., precursor layer deposition and post-treatment) performed in different chambers.

There is a variety of ways, in which the capping process can be implemented in multi-station tools, such as those shown in FIG. 6 and FIG. 7. In general, the described process is easily integrated into the Damascene flow, does not require substantial resource-consuming handling of substrates, and can be performed in the same apparatus as a dielectric diffusion barrier deposition. The described methods are also useful for forming interconnects with improved adhesion between copper and dielectric diffusion barrier.

Certain embodiments of the described methods will now be illustrated by specific examples.

Experimental Examples

Certain disclosed embodiments were tested using 200 mm and 300 mm wafers. Aluminum atoms are detected on Cu surface having Cu—O surface bonds after exposing Cu to TMA at wafer temperature between 80 to 200° C. No plasma is used prior to and during TMA exposure. A direct plasma of $NH_3$ is used for post-treatment after TMA exposure. Aluminum and oxygen atoms are detected at the interface of SiC/Cu layers for wafer treated with TMA prior to SiC deposition. There is no significant Al atom diffusion into SiC Cu bulk films after 400° C. 12 hr thermal annealing. In addition, there is no increase in Cu resistance upon TMA exposure and after 400° C. 12 hr thermal annealing. These results indicate that Al atoms on Cu surface are immobile. Film adhesion of SiC on Cu measured by 4-point bending technique shows significant improvement so that no delamination is observed at SiC/Cu interface.

In one example, the wafer comprising copper having surface oxide was preheated in $N_2$ for 40 seconds and was treated with TMA for 2 seconds, followed by 40 second purge after treatment and pumping for 25 seconds. The presence of Al atoms on copper surface was verified by TOF SIMS shown in FIG. 4, which indicates that Al atoms are present on TMA-treated surface.

To verify the existence of Al atoms and composition at the interface of barrier and Cu with TMA exposure prior to barrier deposition, SIMS depth profiling was used to detect surface elements on SiC/Cu wafers. The results indicate that aluminum and oxygen are present at the interface of SiC/Cu.

To investigate Al diffusion behavior, the same wafer was annealed in a forming gas at 400° C. for 12 hrs. The SIMS depth profiles of annealed and non-annealing samples show no significant diffusion of Al into either SiC or Cu bulk film.

To determine any Cu resistance change upon TMA exposure, resistance of Cu interconnects subjected to various TMA exposure conditions were measured before and after TMA exposure. The Cu resistance data are listed in TABLE 1. The results demonstrate that there is no resistance increase but slight decrease in Cu resistance with TMA exposure.

Figure 8:
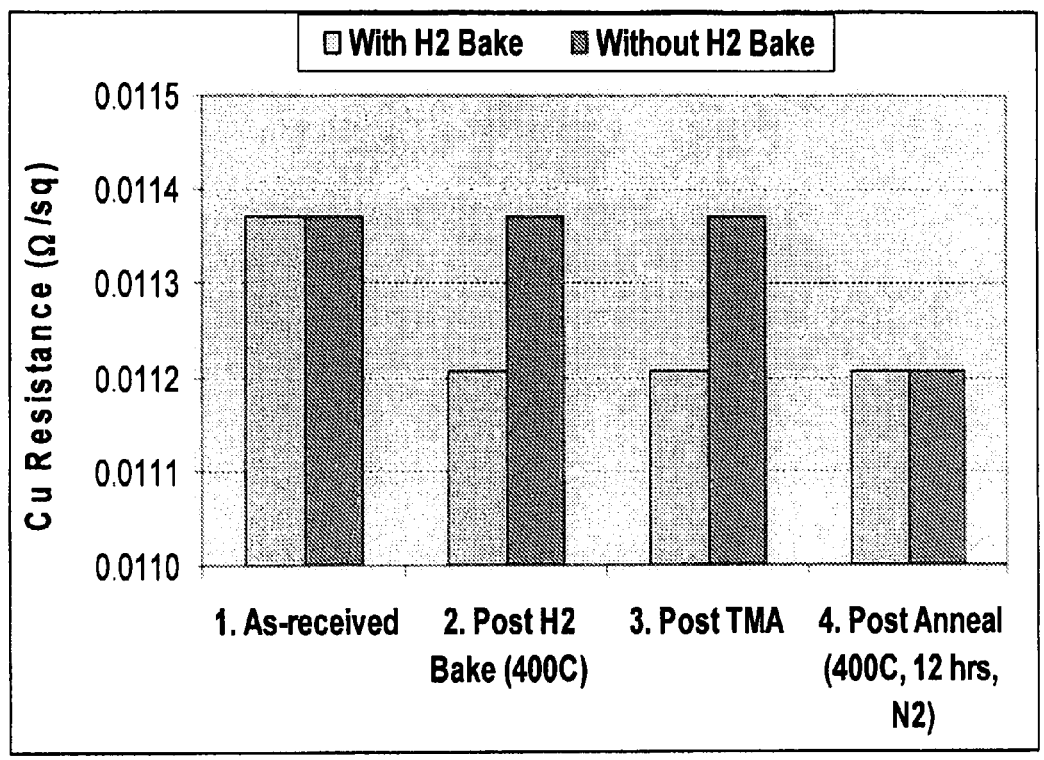
FIG. 8 is an experimental plot illustrating copper resistance before and after treatment with trimethylaluminum.

In addition, Cu resistance was measured at various stages of Cu processes, i.e., as-aged, post $H_2$ annealing, post TMA exposure, and post thermal annealing in forming gas at 400° C. for 12 hrs. The Cu resistance data are shown in FIG. 8.

Again the results demonstrate that there is no Cu resistance increase upon TMA exposure as well after long thermal annealing.

The above tests confirm that Al atoms on Cu film are limited to Cu surface only and they are immobile. Their concentration is either very low such that does not increase Cu resistance or they do not diffuse into Cu bulk film at all.

TABLE 1

Copper resistance change with different TMA exposure conditions.

| # | Temperature e (° C.) | TMA time (s) | Rs before TMA | Rs post TMA | Rs Change (%) |
|---|---|---|---|---|---|
| 1 | 80 | 1 | 0.2098 | 0.2088 | −0.44 |
| 2 | 80 | 10 | 0.2096 | 0.2088 | −0.40 |
| 3 | 80 | 50 | 0.2104 | 0.2095 | −0.42 |
| 4 | 80 | 100 | 0.1971 | 0.1960 | −0.53 |
| 5 | 80 | 100 × 2 | 0.1967 | 0.1954 | −0.66 |
| 6 | 150 | 1 | 0.1970 | 0.1888 | −4.16 |
| 7 | 150 | 10 | 0.1949 | 0.1864 | −4.37 |
| 8 | 150 | 50 | 0.1968 | 0.1887 | −4.10 |
| 9 | 150 | 100 | 0.2090 | 0.2033 | −2.73 |
| 10 | 200 | 1 | 0.2098 | 0.2043 | −2.62 |
| 11 | 200 | 10 | 0.2105 | 0.2019 | −4.11 |
| 12 | 200 | 50 | 0.2100 | 0.1981 | −5.65 |
| 13 | 200 | 100 | 0.2104 | 0.1979 | −5.96 |
| 14 | 200 | 100 × 2 | 0.2092 | 0.1951 | −6.72 |
| 15 | No | No | 0.2090 | 0.2091 | 0.04 |

To verify the effects of aluminum presence at the SiC/Cu interface for film adhesion improvement, standard 4-point bending tests were conducted. Three splits were tested on 300 mm wafers. In the first example. no treatment prior to SiC deposition was performed. In the second example the wafer was treated with $NH_3$ direct plasma prior to SiC deposition on Cu. In the third example, the wafer was treated with TMA, followed by NH3 direct plasma treatment and SiC deposition.

Figure 9:
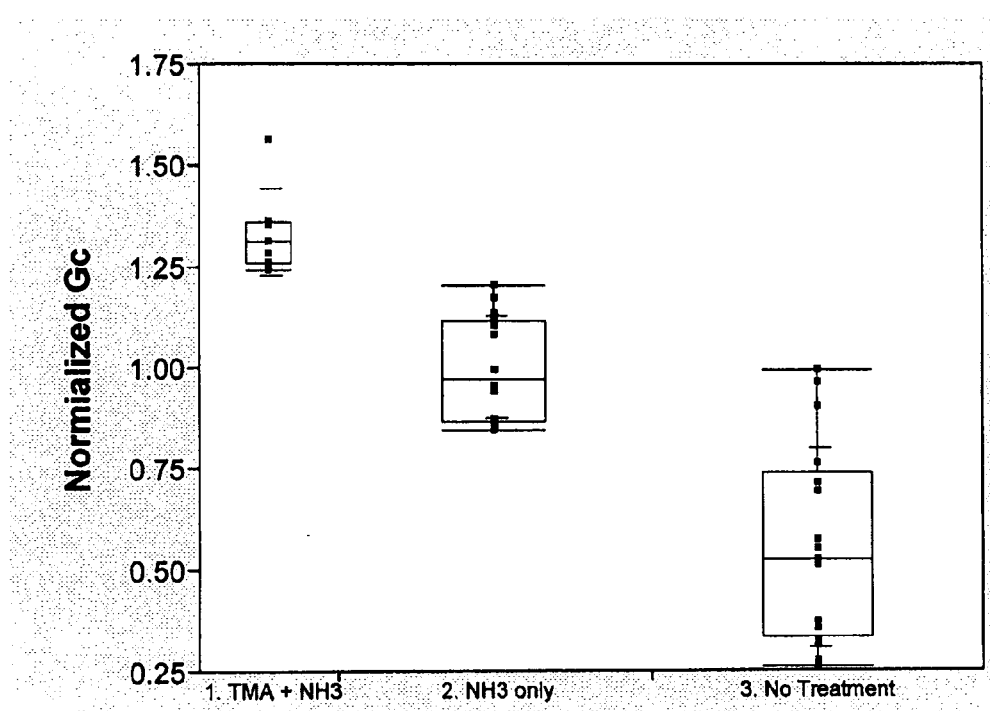
FIG. 9 is an experimental plot illustrating adhesion of copper to diffusion barrier layer in structures with and without adhesion layers.

The adhesion data shown in FIG. 9 clearly demonstrate that introduction of Al atoms by using TMA treatment increases SiC to Cu adhesion. Interestingly, the interface failure of TMA-treated samples was observed not at the SiC/Cu interface but at Cu/Cu-seed/TaN barrier interface or at $SiO_2$ underlayer. The measured Gc is lower than the real Gc of SiC/Cu interface because the SiC/Cu interface does not delaminate.

To assess the effects of the presence of Al atoms at the SiC/dielectric interface for film adhesion improvement, standard 4-point bending tests were conducted. Two splits were tested on 300 mm wafers. In the first example the wafer was treated with $NH_3$ direct plasma prior to SiC deposition on Cu. In the second example, the wafer was treated with TMA, followed by NH3 direct plasma post-treatment and SiC deposition.

Figure 10:
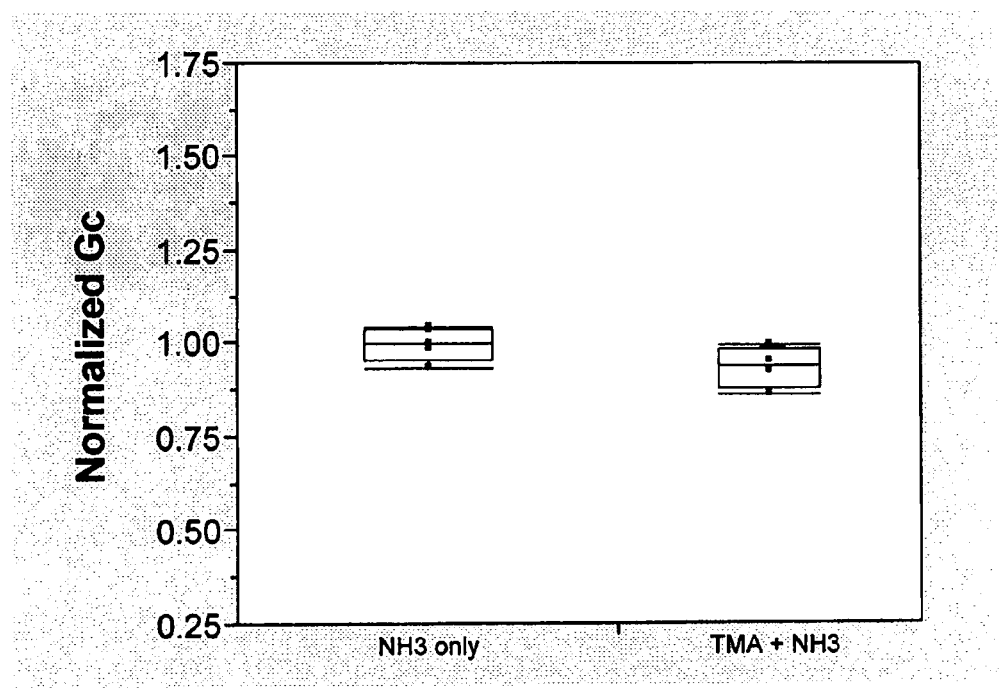
FIG. 10 is an experimental plot illustrating adhesion of inter-metal dielectric (IMD) to diffusion barrier layer in structures with and without adhesion layers.

The adhesion data shown in FIG. 10 indicate that introduction of Al atoms by using TMA treatment does not change the adhesion of SiC to IMD dielectric as the Gc values are statistically the same. This result implies that with the introduction of Al metals, the properties of SiC/IMD dielectric interface is not modified dramatically as in the case of SiC/Cu interface.

In another experiment electromigration data for TMA-treated and untreated interconnects was measured. In a first data split, referred to as "baseline," the structure includes a silicon and carbon containing dielectric diffusion barrier layer located directly on top of the copper interconnect. In other words, the diffusion barrier was deposited directly onto the exposed surface of the copper interconnect without any intervening layer. The second data split, referred, was produced from structures having an intervening layer between the copper surface and the diffusion barrier. In this case, the planarized substrate, with copper interconnect exposed, was contacted once with TMA before purging. The third data split was produced from structures fabricated in the same manner as those in the second split, but with five cycles of TMA exposure prior to diffusion barrier formation. Each cycle involved contact with TMA followed by purging.

Figure 11:
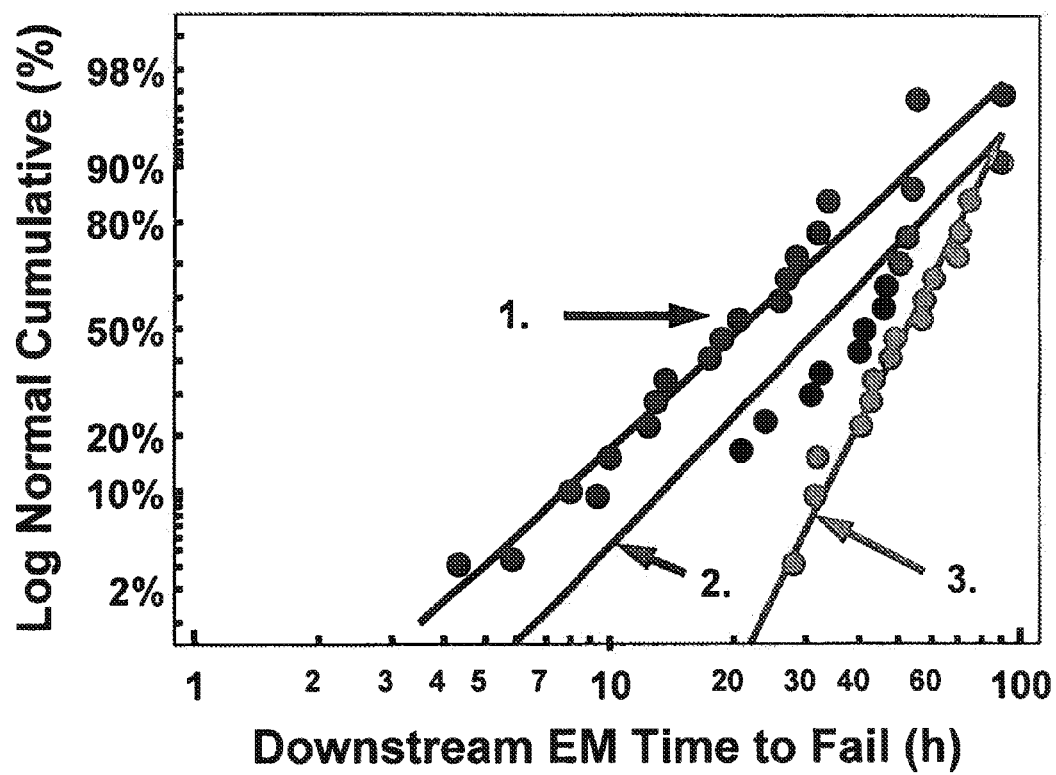
FIG. 11 is an experimental plot illustrating electromigration failure rates for interconnects with and without adhesion layers.

Electromigration data for the above three structures is shown in FIG. 11. Experiments were conducted at temperature of 325° C. and current density J of 2.5 MA/cm2. $J_{max}$ was calculated for 0.1% of the structures failing at 11 years using Black's equation and the referenced JEDEC standard. As it can be seen from FIG. 11, the structures from the second data split performed significantly better than the baseline structures, and the structures from the third data split performed better still.

CONCLUSION

One or more of the above-disclosed embodiments provide one or more of the following improvements.

There is little or no increase of Cu resistance due to dopant incorporation or diffusion into Cu bulk film because only monolayer or ultra-thin surface of bonding atoms is added onto the Cu surface and these atoms are constrained on the surface and are in a form of stable and immobile metallic oxide or other compound.

There is no leakage path on the surrounding IMD dielectric of Cu lines because those foreign atoms are in a form of non-conducting metallic oxide or another non-conductive compound. No metallic atoms are on the IMD dielectric.

There is little or no increase in capacitance or RC time due to those bonding atoms because they are in a monolayer or ultra-thin surface layer.

Film adhesion and cohesive strength between the dielectric copper barrier and Cu is significantly improved.

Cu electromigration (EM) resistance is improved because film adhesion and cohesive strength are increased by the addition of surface foreign atoms pinning mobile Cu atoms.

Spontaneous chemical reaction between a metallic precursor and substrate materials (Cu and IMD/ILD dielectric having surface O atoms) is used to add foreign metallic atoms onto the substrate surface.

Use of a controlled metal-containing precursor dosage allows to uniformly cover the substrate surface with only a monolayer of additional atoms by chemisorption. The added foreign atoms are only limited to the surface. No thick metal layer or its oxide layer is deposited on the substrate. No dopant diffusion into metal (e.g., Cu) bulk is observed.

The surface metallic oxide layer is stable, impermeant, and immobile. It is not conducting to cause leakage or TDDB degradation.

It passivates not only the Cu surface to improve EM but also surrounding IMD dielectric to prevent dielectric damage due to pre-treatment prior to the deposition of copper barrier or possible dielectric damage or dielectric constant degradation due to plasma exposure during down-stream processes.

Some of the disclosed embodiments can use an existing PDL (pulsed deposition layer) tools or modified PDL components for TMA (trimethyl aluminum) treatment.

Commonly owned U.S. patent application Ser. No. 11/726, 363, titled "Protective Self-aligned Buffer Layers for Damascene Interconnects" filed Mar. 20, 2007, naming Yu et al. as inventors, U.S. patent application Ser. No. 11/709,293, titled "Protective Self-aligned Buffer Layers for Damascene Interconnects" filed Feb. 20, 2007, naming Chattopadhyay et al. as inventors, and U.S. patent application Ser. No. 10/980,076 filed Nov. 3, 2004, titled "Protection of Cu Damascene Interconnects by Formation of a Self-aligned Buffer Layer," naming van Schravendijk et al. as inventors, all are incorporated herein by reference in their entireties and for disclosure process operations and sub-structures common to the invention disclosed herein.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a semiconductor device structure, the method comprising:
   (a) contacting a semiconductor substrate having
      (i) a layer of a first metal M1, comprising exposed M1-oxygen bonds on its surface and
      (ii) an exposed layer of dielectric
   with a precursor compound comprising a second metal M2, to form an adhesion layer comprising M2-oxygen bonds at least over the layer of the first metal M1; and
   (b) depositing a dielectric diffusion barrier layer in contact with the adhesion layer.

2. The method of claim 1, wherein the precursor compound is an organometallic compound, and wherein the method further comprises:
   treating the adhesion layer to remove residual organic groups prior to deposition of the dielectric diffusion barrier layer.

3. The method of claim 2, wherein the first metal M1 is copper and wherein the second metal M2 is aluminum.

4. The method of claim 3, wherein treating the adhesion layer to remove residual organic groups comprises forming aluminum-hydrogen bonds, aluminum-nitrogen bonds or both.

5. The method of claim 3, wherein treating the adhesion layer to remove residual organic groups comprises exposing the substrate to a plasma generated in a process gas comprising a gas selected from the group consisting of $NH_3$, $H_2$, $N_2$, and mixtures thereof.

6. The method of claim 3, wherein treating the adhesion layer to remove residual organic groups comprises exposing the substrate to radicals from a remote plasma generated in a process gas comprising a gas selected from the group consisting of $NH_3$, $H_2$, $N_2$, and mixtures thereof.

7. The method of claim 3, wherein treating the adhesion layer to remove residual organic groups comprises exposing the substrate to ultraviolet radiation in a process gas comprising a gas selected from the group consisting of $NH_3$, $H_2$, $N_2$, and mixtures thereof.

8. The method of claim 3, wherein treating the adhesion layer to remove residual organic groups comprises heating the substrate in a process gas comprising a gas selected from the group consisting of $NH_3$, $H_2$, $N_2$, and mixtures thereof.

9. The method of claim 3, wherein the exposed dielectric is an ultra low-k (ULK) dielectric having a dielectric constant of less than about 2.8, and wherein the treatment of the adhesion layer does not substantially damage the dielectric.

10. The method of claim 1, further comprising controllably treating the substrate surface prior to (a) to remove a portion of an oxide of the first metal, while leaving no more than about 10 Å of said oxide.

11. The method of claim 1, further comprising prior to (a) completely removing an oxide of the first metal from the surface of the first metal layer and controllably forming a new layer of first metal oxide having a thickness of no more than about 10 Å.

12. The method of claim 10, wherein the exposed dielectric is an ultra low-k (ULK) dielectric having a dielectric constant of less than about 2.8, and wherein the controllable treatment does not substantially damage the dielectric.

13. The method of claim 10, wherein the controllable treatment to remove bulk amount of metal oxide is selected from the group consisting of plasma treatment, remote plasma treatment, thermal treatment, and UV treatment, wherein said treatment is performed in a reducing atmosphere.

14. The method of claim 1, wherein in (a), formation of the adhesion layer is limited by adsorption of the precursor on the substrate surface.

15. The method of claim 1, wherein the adhesion layer comprises an atomic monolayer of the second metal, wherein the second metal is bonded at least to oxygen.

16. The method of claim 1, wherein (a) comprises contacting the substrate with the precursor comprising the second metal in an absence of plasma at a substrate temperature of between about 80-350° C.

17. The method of claim 1, wherein the second metal from the adhesion layer does not substantially diffuse into the first metal layer.

18. The method of claim 1, wherein the precursor comprises trimethylaluminum.

19. The method of claim 1, wherein the dielectric diffusion barrier comprises a doped or undoped material selected from the group consisting of SiC or SiN and SiNC.

20. The method of claim 1, wherein the dielectric diffusion barrier comprises at least two sub-layers, wherein one such sub-layer comprises undoped silicon carbide, oxygen doped silicon carbide, or nitrogen doped silicon carbide and wherein another such sub-layer comprises a different material.

21. The method of claim 1, wherein the second metal M2 is selected from the group consisting of titanium, calcium, and magnesium.

22. A semiconductor device comprising:
   a layer of copper embedded in a ULK dielectric layer having a dielectric constant of less than about 2.8; and
   a dielectric diffusion barrier layer at an interface between the copper layer and the ULK dielectric layer, wherein said interface comprises an adhesion layer having O-M2-N—Si adhesion between the copper layer and the dielectric diffusion barrier layer, wherein M2 is a metal.

23. An apparatus for semiconductor device processing, the apparatus comprising one or more process chambers configured for semiconductor device processing and a controller comprising program instructions for:
   (a) pre-treating a semiconductor substrate having an exposed metal oxide to controllably remove a portion of the metal oxide without completely removing all of the metal oxide;
   (b) contacting the semiconductor substrate with a precursor compound comprising a second metal M2 to react with the metal oxide and to form an adhesion layer comprising M2-oxygen bonds at least on the layer of the first metal; and
   (c) depositing a dielectric diffusion barrier onto the semiconductor substrate in contact with the adhesion layer.

* * * * *